(12) United States Patent
Jang

(10) Patent No.: US 11,864,437 B2
(45) Date of Patent: Jan. 2, 2024

(54) DISPLAY DEVICE INCLUDING ANISOTROPIC CONDUCTIVE FILM AND METHOD OF MANUFACTURING DISPLAY DEVICE

(71) Applicant: SAMSUNG DISPLAY CO., LTD., Yongin-si (KR)

(72) Inventor: Joo-Nyung Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 217 days.

(21) Appl. No.: 17/453,216

(22) Filed: Nov. 2, 2021

(65) Prior Publication Data
US 2022/0199743 A1    Jun. 23, 2022

(30) Foreign Application Priority Data
Dec. 22, 2020    (KR) .................. 10-2020-0180994

(51) Int. Cl.
*H10K 59/131*    (2023.01)
*H01L 23/00*    (2006.01)
(Continued)

(52) U.S. Cl.
CPC .......... *H10K 59/131* (2023.02); *H01L 24/29* (2013.01); *H01L 24/83* (2013.01); *H10K 71/00* (2023.02);
(Continued)

(58) Field of Classification Search
CPC .. H10K 59/131; H10K 71/00; H10K 59/1201; H10K 59/12; H10K 50/8426;
(Continued)

(56) References Cited

U.S. PATENT DOCUMENTS 8,987,607 B2    3/2015    Ozeki et al.
2005/0151271 A1*    7/2005    Tatsuzawa .......... H01L 23/4828
                                                                428/209
(Continued)

FOREIGN PATENT DOCUMENTS

JP    3458707    8/2003
KR    1020090073369    7/2009
KR    10-1785151    9/2017

*Primary Examiner* — Kyoung Lee
(74) *Attorney, Agent, or Firm* — F. CHAU & ASSOICATES, LLC

(57) ABSTRACT

A display device includes a first substrate that includes a first electrode, a second substrate disposed under the first substrate and that includes, a second electrode that overlaps the first electrode, and an anisotropic conductive film disposed between the first substrate and the second substrate. The anisotropic conductive film includes an insulating resin layer and a plurality of conductive particles in the insulating resin layer. The conductive particles include first conductive particles that overlap the first electrode and the second electrode, and second conductive particles other than the first conductive particles. Each of the first conductive particles and the second conductive particles includes a first flat surface, a second flat surface that faces the first flat surface, and a curved surface rounded between the first flat surface and the second flat surface.

24 Claims, 18 Drawing Sheets

(51) Int. Cl.
*H10K 71/00* (2023.01)
*H10K 59/12* (2023.01)

(52) U.S. Cl.
CPC .......... *H01L 2224/2919* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/83143* (2013.01); *H01L 2224/83851* (2013.01); *H10K 59/1201* (2023.02)

(58) Field of Classification Search
CPC . H01L 24/29; H01L 24/83; H01L 2224/2919; H01L 2224/29339; H01L 2224/29344; H01L 2224/29347; H01L 2224/29355; H01L 2224/29357; H01L 2224/83143; H01L 2224/83851; H01L 24/33; H01L 24/27; H01L 24/32; H01L 25/0753; H01L 2224/27005; H01L 2224/2711; H01L 2224/2929; H01L 2224/2939; H01L 2224/29439; H01L 2224/29444; H01L 2224/29447; H01L 2224/29455; H01L 2224/29457; H01L 2224/29499; H01L 2224/32145; H01L 2224/33051; H01L 2224/331; H01L 2224/33505; H01L 2224/33517; H01L 2224/83102; H01L 2224/83191; H01L 2224/83399; H01L 2224/83855; H01L 2224/83906; G02F 1/1345; G02F 1/116; H01B 5/14

See application file for complete search history.

(56) References Cited

U.S. PATENT DOCUMENTS

2011/0095235 A1  4/2011  Akutsu et al.
2012/0279781 A1  11/2012  Ozeki et al.
2017/0309646 A1* 10/2017  Son .................. G06F 1/163

* cited by examiner

DISPLAY DEVICE INCLUDING ANISOTROPIC CONDUCTIVE FILM AND METHOD OF MANUFACTURING DISPLAY DEVICE

CROSS-REFERENCE TO RELATED APPLICATION

This application claims priority under 35 USC § 119 from Korean Patent Application No. 10-2020-0180994, filed on Dec. 22, 2020 in the Korean Intellectual Property Office (KIPO), the contents of which are herein incorporated by reference in their entirety.

1. TECHNICAL FIELD

Embodiments are directed to a display device that includes an anisotropic conductive film and a method of manufacturing the display device.

2. DISCUSSION OF THE RELATED ART

A display device may be classified as a liquid crystal display (LCD), an organic light emitting diode display (OLED display), a plasma display panel (PDP), an electrophoretic display, or a quantum dot (QD) display, etc., according to a light emission type.

In general, a display device includes a display panel that displays an image and a circuit member that drives the display panel. Examples of a circuit member include a driving chip and a printed circuit board (PCB), and those are mostly mounted on an edge of the display panel. For example, the driving chip may be directly mounted on the display panel through an anisotropic conductive film (ACF) (chip on glass; COG), or may be mounted on a tape carrier package (TCP) or a flexible film so as to be connected to the display panel through an anisotropic conductive film (chip on film; COF).

Recently, as display device acquire higher resolution, the area of a non-display area of the display device has decreased, and the width and gap of a wiring have become narrower. In addition, as a tiled display has been developed, a gap between display panels is narrowing. When the gap between the display panels of a tiled display exceeds about 150 micrometers, a boundary between the display panels may be visually perceived by a user. Accordingly, the display quality of the display device is deteriorated. Thus, since the area of the non-display area of a display device needs to be narrower, the circuit member may be bonded to a rear side of the display panel by using an anisotropic conductive film. However, when a circuit member is bonded to the display panel by using the anisotropic conductive film, high pressure may be applied to the display panel.

SUMMARY

Embodiments of the present disclosure provide a display device that includes an anisotropic conductive film that bonds a circuit member to a rear side of the display panel at a low pressure, and a method of manufacturing the display device.

Embodiments of the present disclosure provide a display device that includes an anisotropic conductive film that prevents a short-circuit between electrodes, and a method of manufacturing the display device.

A display device according to an embodiment includes a first substrate that includes a first electrode, a second substrate disposed under the first substrate and that includes a second electrode that overlaps the first electrode, and an anisotropic conductive film disposed between the first substrate and the second substrate. The anisotropic conductive film includes an insulating resin layer and a plurality of conductive particles disposed in the insulating resin layer. The conductive particles include first conductive particles that overlap the first electrode and the second electrode, and second conductive particles other than the first conductive particles. Each of the first conductive particles and the second conductive particles includes a first flat surface, a second flat surface that faces the first flat surface, and a curved surface rounded between the first flat surface and the second flat surface. A first length of each of the first conductive particles and the second conductive particles in a first direction from the first substrate to the second substrate is less than a second length of each of the first conductive particles and the second conductive particles in a second direction orthogonal to the first direction.

In an embodiment, the insulating resin layer has a thickness greater than or equal to the first length and less than or equal to twice the first length.

In an embodiment, the first flat surface of each of the conductive particles contacts the first electrode, and the second flat surface of each of the conductive particles contacts the second electrode.

In an embodiment, each of the first and second flat surfaces of each of the conductive particles has a circular shape in a plan view.

In an embodiment, each of the conductive particles includes a polymer bead that includes a thermoplastic resin, and a coating layer that surrounds the polymer bead and includes a metal.

In an embodiment, the display device further comprises a non-conductive film disposed between the second substrate and the anisotropic conductive film.

A display device according to an embodiment includes a first substrate that includes a first electrode, a second substrate disposed under the first substrate and that includes a second electrode that overlaps the first electrode, and an anisotropic conductive film disposed between the first substrate and the second substrate. The anisotropic conductive film includes an insulating resin layer and a plurality of conductive particles disposed in the insulating resin layer. The conductive particles include first conductive particles that overlap the first electrode and the second electrode, and second conductive particles other than the first conductive particles. A first length of each of the first conductive particles in a first direction from the first substrate to the second substrate is less than a second length of each of the first conductive particles in a second direction orthogonal to the first direction. A third length of each of the second conductive particles in the first direction is greater than a fourth length of each of the second conductive particles in the second direction.

In an embodiment, each of the first conductive particles and the second conductive particles includes a first flat surface, a second flat surface that faces the first flat surface, and a curved surface rounded between the first flat surface and the second flat surface.

In an embodiment, the first flat surface of each of the first conductive particles contacts the first electrode, and the second flat surface of each of the first conductive particles contacts the second electrode.

In an embodiment, the second flat surface of each of the second conductive particles forms a right angle with respect to a first surface of the first substrate.

In an embodiment, the second flat surface of each of the second conductive particles forms an angle greater than about 45 degrees and less than about 90 degrees with respect to a first surface of the first substrate.

In an embodiment, the insulating resin layer has a thickness greater than or equal to the first length of each of the first conductive particles, and less than or equal to twice the third length of each of the second conductive particles.

A method of manufacturing a display device according to an embodiment includes pressing each of a plurality of polymer beads in one direction, forming a plurality of conductive particles by plating the plurality of pressed polymer beads with metal, applying an uncured resin layer to the plurality of conductive particles, bonding a first substrate that includes a first electrode to a second substrate that includes a second electrode with the uncured resin layer interposed therebetween, and curing the uncured resin layer so that the conductive particles are fixed in the cured resin layer.

In an embodiment, the method further includes, before applying the uncured resin layer, arranging a long axis of each of the plurality of conductive particles to be parallel to a first surface of the first substrate, and arranging a short axis of each of the plurality of conductive particles that is orthogonal to the long axis to be perpendicular to the first surface.

In an embodiment, the resin layer has a thickness greater than or equal to a length of the short axis of each of the plurality of conductive particles, and less than or equal to twice the length of the short axis.

In an embodiment, the method further includes, before applying the uncured resin layer, arranging a short axis of each of the plurality of conductive particles to be parallel to a first surface of the first substrate, and arranging a long axis of each of the plurality of conductive particles orthogonal to the short axis to be perpendicular to the first surface.

In an embodiment, the plurality of conductive particles includes first conductive particles that overlap the first electrode and the second electrode, and second conductive particles other than the first conductive particles. Bonding the first substrate to the second substrate includes arranging the long axis of each of the first conductive particles to be parallel to the first surface of the first substrate, arranging the short axis of each of the first conductive particles to be perpendicular to the first surface, arranging the long axis of each of the second conductive particles to be perpendicular to the first surface of the first substrate and arranging the short axis of each of the second conductive particles to be parallel to the first surface.

In an embodiment, the resin layer has a thickness greater than or equal to a length of the short axis of each of the first conductive particles, and less than or equal to twice a length of the long axis of each of the second conductive particles.

In an embodiment, the plurality of conductive particles is arranged using an external magnetic field after magnetizing the plurality of conductive particles.

In an embodiment, the method further includes, before applying the uncured resin layer, arranging the plurality of conductive particles in a jig including a groove.

A method of manufacturing a display device according to an embodiment includes pressing each of a plurality of polymer beads in one direction; forming a plurality of conductive particles by plating the plurality of pressed polymer beads with metal; arranging a first axis of each of the plurality of conductive particles to be parallel to a first surface of the first substrate, and arranging a second axis of each of the plurality of conductive particles that is orthogonal to the first axis to be perpendicular to the first surface; applying an uncured resin layer to the plurality of conductive particles; and bonding a first substrate that includes a first electrode to a second substrate that includes a second electrode with the uncured resin layer interposed therebetween.

In an embodiment, the first axis is a long axis, and the second axis is a short axis. The resin layer has a thickness greater than or equal to a length of the short axis of each of the plurality of conductive particles, and less than or equal to twice the length of the short axis.

In an embodiment, the first axis is a short axis, and the second axis is a long axis. The plurality of conductive particles includes first conductive particles that overlap the first electrode and the second electrode, and second conductive particles other than the first conductive particles. Bonding the first substrate to the second substrate includes arranging the long axis of each of the first conductive particles to be parallel to the first surface of the first substrate and arranging the short axis of each of the first conductive particles to be perpendicular to the first surface, and arranging the long axis of each of the second conductive particles to be perpendicular to the first surface of the first substrate and arranging the short axis of each of the second conductive particles to be parallel to the first surface. The resin layer has a thickness greater than or equal to a length of the short axis of each of the first conductive particles, and less than or equal to twice a length of the long axis of each of the second conductive particles.

In an embodiment, the method further includes curing the uncured resin layer wherein the conductive particles are fixed in the cured resin layer.

According to embodiments of the present disclosure, an anisotropic conductive film is provided that includes pressed conductive particles that have a disc shape. According to a display device that includes an anisotropic conductive film according to an embodiment, circuit members can be attached to a display panel with little pressure. Accordingly, damage to the display panel can be prevented. In addition, a connection area of conductive particles can be secured with little pressure.

According to embodiments of the present disclosure, some of the pressed conductive particles that have a disc shape are horizontally arranged with the display panel and the rest are vertically arranged with the display panel. A display device that includes an anisotropic conductive film that includes the conductive particles can prevent short-circuits between electrodes with an ultra-fine pitch.

DETAILED DESCRIPTION

Figure 1:
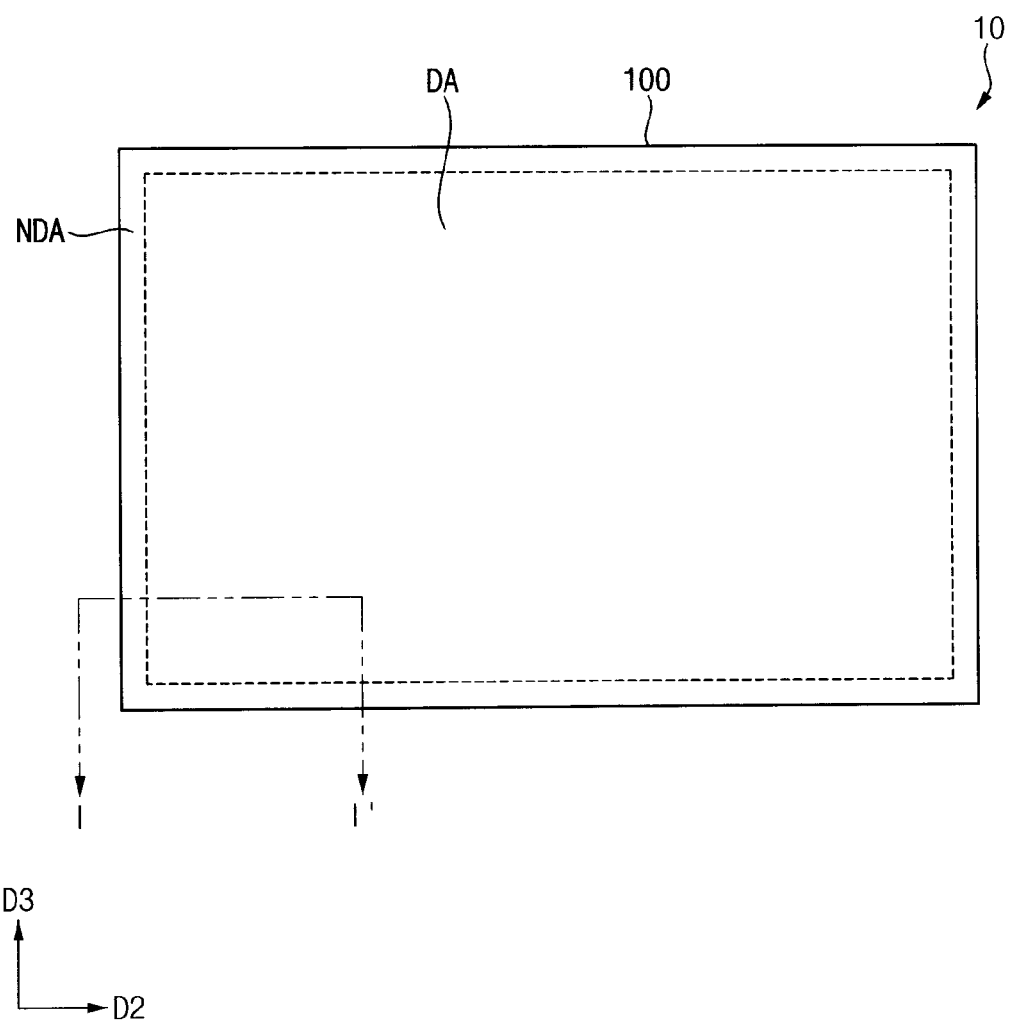
FIG. 1 is a plan view of a display device according to an embodiment of the present disclosure.
Figure 2:
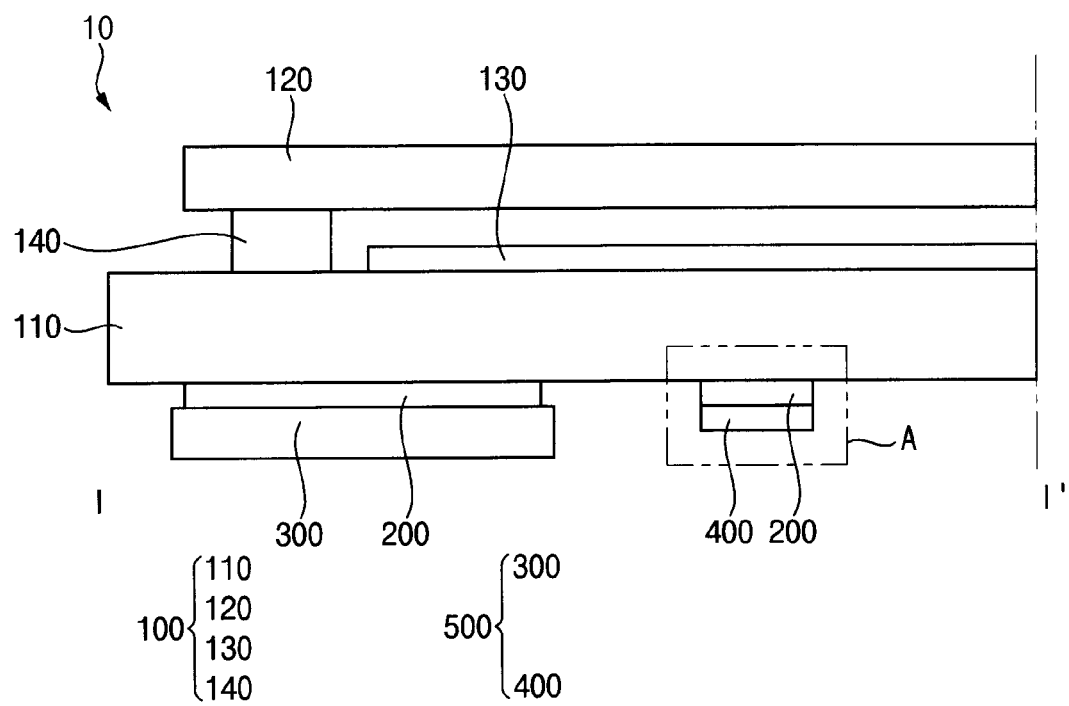
FIG. 2 is a sectional view taken along a line I-I' of FIG. 1.
Figure 3:
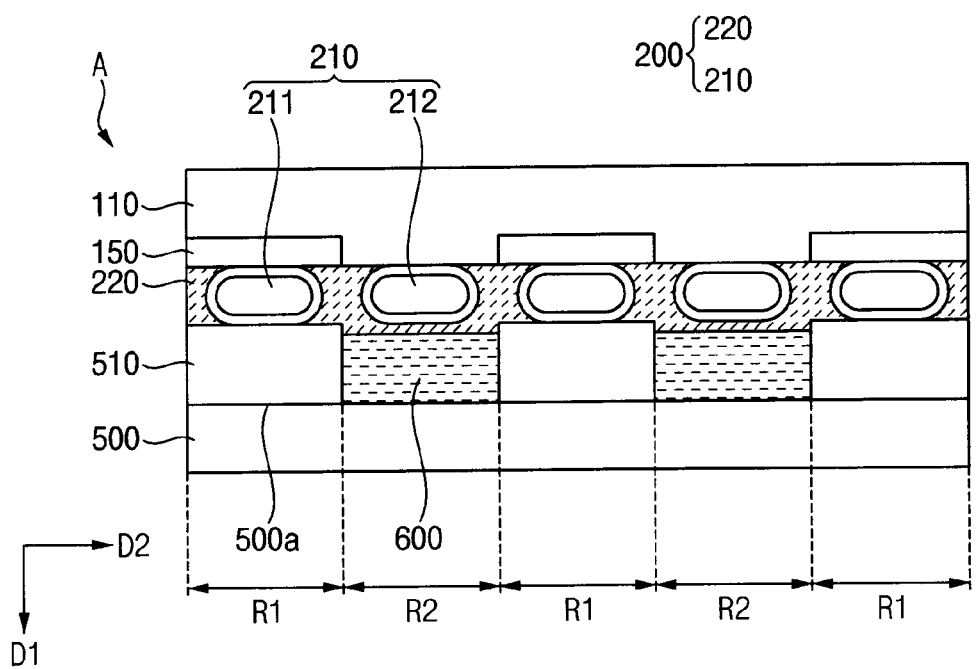
FIG. 3 is an enlarged sectional view of an area A of FIG. 2.

FIG. 1 is a plan view of a display device according to an embodiment of the present disclosure. FIG. 2 is a sectional view taken along a line I-I' of FIG. 1. FIG. 3 is an enlarged sectional view of an area A of FIG. 2.

Referring to FIGS. 1 to 3, according to an embodiment, a display device 10 includes a display panel 100, an anisotropic conductive film 200, a second substrate 500, and a second electrode 510. The display panel 100 is substantially parallel to a plane defined by a second direction D2 and a third direction D3 that is perpendicular to the second direction D2.

According to an embodiment, the display panel 100 displays an image, and is an organic light emitting diode panel. However, embodiments are not limited thereto, and in other embodiments, the display panel 100 may be one of, for example, a liquid crystal display panel, an electrophoretic display panel, an LED Panel, an inorganic electro luminescent (EL) display panel, a field emission display panel (FED), a surface conduction electron-emitter (SED) display panel, a plasma display panel (PDP), a cathode ray tube (CRT) display panel, or a quantum dot (QD) display panel.

In addition, according to an embodiment, the display device 10 is a tiled display in which a plurality of display panels are arranged to display one image. When a gap between display panels 100 of a tiled display is small, the gap is not perceivable by a user. Accordingly, a driving chip 400 and a printed circuit board 300, to be described below, can be disposed on a rear side of the display panel 100 to narrow the gap between the display panels 100. However, embodiments according to the present disclosure are not limited thereto. In other embodiments, the driving chip 400 and the printed circuit board 300 are disposed on a side surface or a top surface of the display panel 100.

According to an embodiment, the display panel 100 includes a first substrate 110, an encapsulation substrate 120, a pixel portion 130, and a sealing member 140. The encapsulation substrate 120 faces the first substrate 110. However, embodiments of the present disclosure are not limited thereto. In other embodiments, the encapsulation substrate 120 and the sealing member 140 are omitted. Accordingly, in other embodiments, the pixel portion 130 is encapsulated by a thin film encapsulation layer, etc., instead of the encapsulation substrate 120. The thin film encapsulation layer includes at least one organic encapsulation film and at least one inorganic encapsulation film. The inorganic encapsulation film protects the pixel portion 130 from moisture and oxygen. The organic encapsulation film protects the pixel portion 130 from foreign substances. The first substrate 110 includes a display area DA and a non-display area NDA. The display area DA is where an image is displayed by light emission, and includes the pixel portion 130. The non-display area NDA is positioned outside the display area DA and is an area in which no image is displayed. A plurality of pixels are disposed in pixel portion 130 of the display area DA of the first substrate 110.

According to an embodiment, the non-display area NDA includes a plurality of pad wirings, etc., that receive external signals and transmit the external signals to a light emitting element that emits light.

There is no particular limitation to a material used for the pad wirings. For example, the pad wirings are formed of the same material as a source electrode and a drain electrode in a thin film transistor. The pad wirings include at least one first electrode 150. Although the first electrode 150 is shown as being embedded in the first substrate 110 in the drawings, the first electrode 150 may protrude from a lower surface of the first substrate 110.

According to an embodiment, the pixel portion 130 is formed on the first substrate 110 and includes a light emitting element and a wiring part that drives the light emitting element. The wiring part of the pixel portion 130 is connected to the driving chip 400. In addition to the light emitting element, any element applicable to the display device 10 constitutes the pixel portion 130.

According to an embodiment, the encapsulation substrate 120 faces the first substrate 110. The encapsulation substrate 120 is laminated to the first substrate 110 through the sealing member 140. The encapsulation substrate 120 covers and protects the pixel portion 130. The encapsulation substrate 120 is smaller in area than the first substrate 110.

According to an embodiment, a polarizing plate is disposed on the encapsulation substrate 120. The polarizing plate prevents reflection of external light. A sealing glass frit, etc., can be used as the sealing member 140. However, in other embodiments, the encapsulation substrate 120 and the sealing member 140 are omitted. In other embodiments, the pixel portion 130 is encapsulated by a thin film encapsulation layer, etc., instead of the encapsulation substrate 120. The second substrate 500 is disposed under the first substrate 110. The second substrate 500 is electrically connected to the first substrate 110 through the anisotropic conductive film 200. The second electrode 510 is attached to a first surface 500a of the second substrate 500. In the drawing, the first surface 500a corresponds to a top surface of the second substrate 500. The second substrate 500 to which the second electrode 510 is attached may correspond to the printed circuit board 300 or the driving chip 400.

According to an embodiment, printed circuit board 300 supplies a driving signal to the display panel 100. The printed circuit board 300 includes a timing controller and a power voltage generator. The timing controller generates a control signal that drives the display panel 100. The power voltage generator generates a power voltage.

According to an embodiment, the printed circuit board 300 is disposed on one surface of the display panel 100. More specifically, the printed circuit board 300 is disposed on a rear side of the display panel 100. In general, since the display panel 100 displays an image on a front side of the display panel 100, the rear side of the display panel 100 corresponds to an area that is not visible to a user. Accordingly, the printed circuit board 300 is disposed on the rear side of the display panel 100 to maximize space efficiency and hide the configuration disposed in the non-display area NDA. However, embodiments are not limited thereto. In other embodiments, the printed circuit board 300 is disposed on a side surface or a top surface of the display panel 100 as necessary.

According to an embodiment, the printed circuit board 300 and the driving chip 400 form a circuit member. The circuit members are electrically connected to the pad wiring by the anisotropic conductive film 200.

According to an embodiment, the printed circuit board 300 includes a base film and a wiring pattern disposed on the base film, and further includes a cover film disposed on the wiring pattern.

According to an embodiment, the base film and the cover film are formed of a flexible, insulating and heat resistant material. For example, the base film and the cover film are formed of polyimide, but embodiments are not limited thereto.

According to an embodiment, the wiring pattern is disposed between the base film and the cover film. The wiring pattern, which transmits electric signals, is formed of a metal such as copper (Cu), and tin, silver, or nickel, etc., may be plated on a surface of the copper.

According to an embodiment, the driving chip 400 is electrically connected to the pad wiring by the anisotropic conductive film 200. The driving chip 400 is an integrated circuit chip such as a driving IC.

According to an embodiment, the driving chip 400 includes a second electrode 510. The driving chip 400 is connected to the pad wiring to control light emission of the light emitting element. The second electrode 510 of the driving chip 400 is connected to the first electrode 150 of the pad wiring by conductive particles 210 of the anisotropic conductive film 200.

According to an embodiment, the driving chip 400 is mounted in a chip on glass (COG) scheme in the non-display area NDA of the first substrate 110 so as to be electrically connected to the pad wiring. However, embodiments are not limited thereto, and in other embodiments, the driving chip 400 is omitted without being mounted in the non-display area NDA. In addition, the driving chip 400 may be mounted on a flexible circuit board in a chip on film (COF) scheme. In other words, a tape carrier package (TCP) in which the driving chip 400 is mounted on a film in a chip form may be incorporated into the display device 10.

According to an embodiment, the anisotropic conductive film 200 is connected between the driving chip 400 and the first electrode 150, and the driving chip 400 is mounted on the first substrate 110. The anisotropic conductive film 200 is disposed between the first electrode 150 and the second electrode 510 and electrically connects the first substrate 110 to the second substrate 500.

Hereinafter, an anisotropic conductive film 200 will be described.

Figure 4:
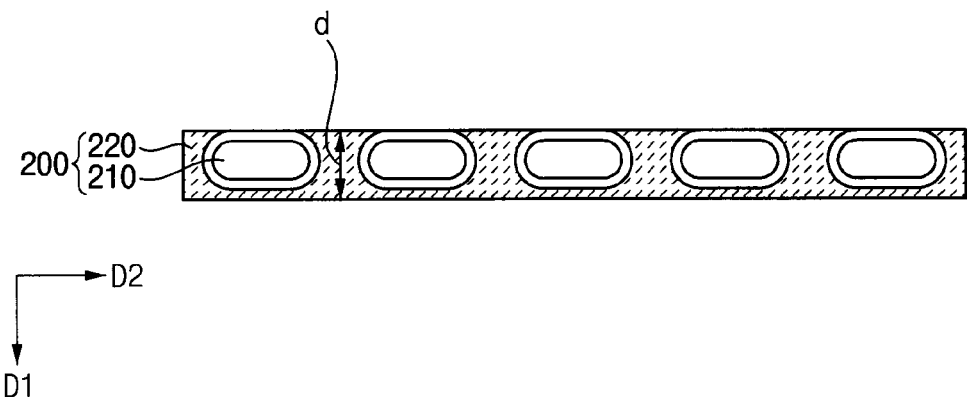
FIG. 4 is a sectional view of an anisotropic conductive film according to an embodiment of the present disclosure.

FIG. 4 is a sectional view of an anisotropic conductive film according to an embodiment of the present disclosure.

Referring to FIGS. 3 and 4, according to an embodiment, the anisotropic conductive film 200 is disposed between the first substrate 110 and the second substrate 500. The anisotropic conductive film 200 includes an insulating resin layer 220 and a plurality of conductive particles 210. The conductive particles 210 are disposed in the insulating resin layer 220. The anisotropic conductive film 200 electrically connects the second substrate 500 to the first substrate 110.

According to an embodiment, the conductive particles 210 are spaced apart from each other at predetermined intervals within the insulating resin layer 220. The conductive particles 210 are arranged in a single layer in the insulating resin layer 220. Positions of the conductive particles 210 are fixed by curing the insulating resin layer 220. Adjacent conductive particles 210 are insulated from each other by the insulating resin layer 220.

According to an embodiment, the conductive particles 210 include first conductive particles 211 that overlap the first electrode 150 and the second electrode 510, and second conductive particles 212 other than the first conductive particles 211. The first conductive particles 211 are those conductive particles 210 positioned in a first region R1 in which the first electrode 150 and the second electrode 510 face and overlap each other. In other words, the first conductive particles 211 are positioned between the first electrode 150 and the second electrode 510. The second conductive particles 212 are those conductive particles 210 positioned in a second region R2 in which the first electrode 150 and the second electrode 510 do not overlap each other. The first conductive particles 211 contact the first electrode 150 and the second electrode 510 in the first region R1. Accordingly, the first electrode 150 and the second electrode 510 are electrically connected to each other through the first conductive particles 211. Thus, signals transmitted through the second substrate 500 are transmitted to the display panel 100 that includes the first substrate 110 to which the first electrode 150 is attached, through the second electrode 510, the first conductive particles 211 and the first electrode 150. The second conductive particles 212 are isolated in the second region R2. In other words, the second conductive particles 212 do not contact the first electrode 150 and the second electrode 510 in the second region R2, and the first conductive particles 211 and the second conductive particles 212, which are adjacent to each other, do not contact each other. Accordingly, even when the second conductive particles 212 are present in the second region R2, short-circuits do not occur between the adjacent first electrodes 150 and between the adjacent second electrodes 510. The second conductive particles 212 are positioned in the second region R2 in an embodiment, however, embodiments are not limited thereto, and in other embodiments, no second conductive particles 212 are positioned in the second region R2.

Figure 5:
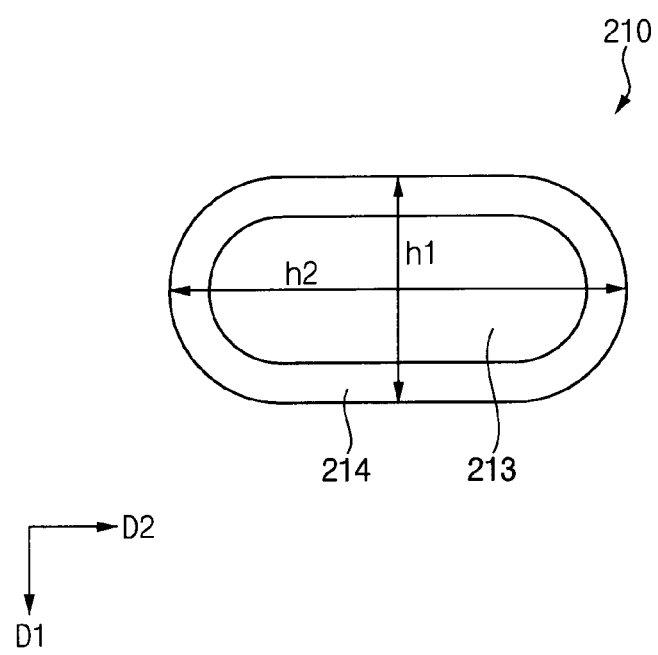
FIG. 5 is a sectional view of a conductive particle according to an embodiment.

FIG. 5 is a sectional view of a conductive particle according to an embodiment.

Referring to FIGS. 3 and 5, according to an embodiment, a first length h1 of each of the conductive particles 210 in a first direction D1, which is a direction from the first substrate 110 to the second substrate 500, is less than a second length h2 of each of the conductive particles 210 in the second direction D2 (or the third direction D3) orthogonal to the first direction D1.

According to an embodiment, the first conductive particles 211 in the first region R1 are subject to pressure in a process of bonding the first substrate 110 to the second substrate 500. Accordingly, each of the first conductive particles 211 in the first region R1 may be deformed by the applied pressure. Since the pressure is applied in the first direction D1, the first length h1 of each of the first conductive particles 211 in the first region R1 may be less than before the deformation, and the second length h2 may be greater than before the deformation. Since the second conductive particles 212 positioned in the second region R2 are not subject to pressure, their shape is maintained. Accordingly, the first length h1 of each of the first conductive particles 211 in the first region R1 may be less than the first length h1 of each of the second conductive particles 212 in the second region R2. Likewise, the second length h2 of each of the first conductive particles 211 in the first region R1 may be greater than the second length h2 of each of the second conductive particles 212 in the second region R2. However, embodiments according to the present disclosure are not limited thereto. In other embodiments, the first conductive particles 211 and the second conductive particles 212 have substantially the same shape.

According to an embodiment, the conductive particles 210 have a diameter of several micrometers, such as about 2 micrometers to about 5 micrometers. In other words, each of the first length h1 and the second length h2 has a size of about 2 micrometers to about 5 micrometers. In addition, each of the conductive particles 210 has a size and a shape that differ from each other. Accordingly, not all of each of the conductive particles 210 are positioned inside the insulating resin layer 220, and a part of each conductive particle 210 protrudes from the insulating resin layer 220. In other words, each conductive particle 210 partially protrudes upward from a top surface of the insulating resin layer 220, and partially protrudes downward from a bottom surface of the insulating resin layer 220.

According to an embodiment, each of the conductive particles 210 includes a polymer bead 213 that contains a thermoplastic resin. The thermoplastic resin, for example, includes at least one of polyethylene, nylon, polyacetyl resin, vinyl chloride resin, polystyrene, ABS resin, or acrylic resin. Each of the conductive particles 210 includes a coating layer 214 that surrounds the polymer bead 213 and contains a metal. The metal, for example, includes at least one of nickel, cobalt, gold, silver, or copper, etc.

Figure 6:
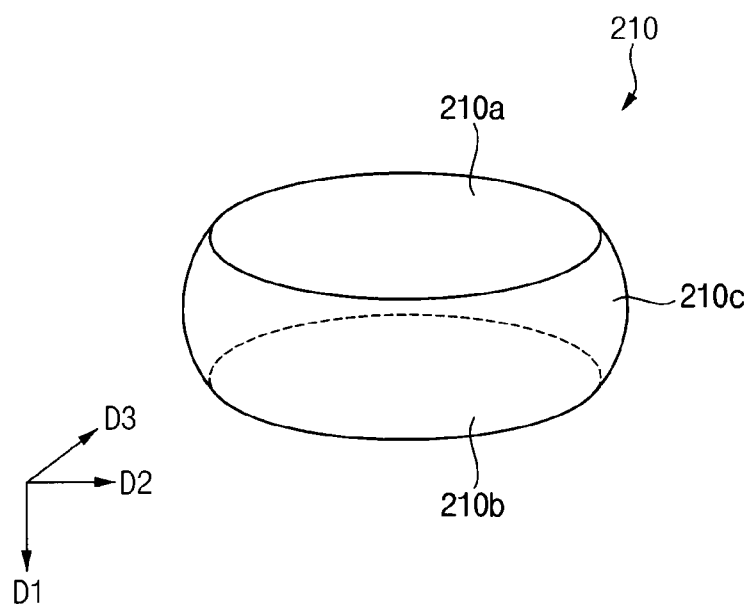
FIG. 6 is a perspective view of a conductive particle according to an embodiment.

FIG. 6 is a perspective view of a conductive particle according to an embodiment.

Referring to FIGS. 3 and 6, according to an embodiment, each of the conductive particles 210 has a shape of a sphere that was pressed in the first direction D1. Each of the conductive particles 210 includes a first flat surface 210a, a second flat surface 210b that faces the first flat surface 210a, and a curved surface 210c rounded between the first flat surface 210a and the second flat surface 210b. Each of the first and second flat surfaces 210a and 210b has a circular shape that extends in the second direction D2 and the third direction D3 in a plan view. In addition, a sectional shape parallel to the first flat surface 210a of each conductive particle 210 is also circular. In an embodiment, each conductive particle 210 is radially symmetric about an axis parallel to the first direction D1, and thus statements about each conductive particle 210 with respect to the second direction D2 also apply to the third direction D3. However, embodiments are not limited thereto, and in other embodiments, each of the conductive particles 210 has a three-dimensional shape other than a pressed spherical shape.

According to an embodiment, the first flat surface 210a of each conductive particle 210 contacts the first electrode 150. The second flat surface 210b of each conductive particle 210 contacts the second electrode 510. Accordingly, electricity flows between the first electrode 150 and the second electrode 510 through the conductive particles 210. In addition, the curved surface 210c of each conductive particle 210 contacts the insulating resin layer 220. Electricity does not flow between adjacent first electrodes 150 and between adjacent second electrodes 510 through the insulating resin layer 220, and accordingly, a short-circuit does not occur.

Referring again to FIGS. 3 to 5, there are uniform gaps between adjacent conductive particles 210. The conductive particles 210 are fixed so as not to move in the cured insulating resin layer 220.

According to an embodiment, the insulating resin layer 220 is disposed between the first substrate 110 and the second substrate 500. In addition, the plurality of conductive particles 210 are disposed in the insulating resin layer 220. The insulating resin layer 220 contacts the first substrate 110. The insulating resin layer 220 does not contact the second substrate 500. However, embodiments of the present disclosure are not limited thereto. In other embodiments, the insulating resin layer 220 contacts the second substrate 500. The insulating resin layer 220 is thinner in the first region R1 than the second region R2.

According to an embodiment, a thickness d in the first direction D1 of the insulating resin layer 220 is greater than or equal to the first length h1 of each conductive particle 210. The thickness d of the insulating resin layer 220 is less than or equal to twice the first length h1 of each conductive particle 210.

According to an embodiment, when the thickness d of the insulating resin layer 220 is less than the first length h1, the insulating resin layer 220 does not contact the second electrode 510 or the first substrate 110. In this case, an electrical connection between the first substrate 110 and the second substrate 500 is weakly formed. In addition, when the thickness d of the insulating resin layer 220 is less than the first length h1 of each conductive particle 210, a part of each conductive particle 210 in the insulating resin layer 220 may be reduced in size. Accordingly, the conductive particles 210 might not be fixed in the insulating resin layer 220.

According to an embodiment, when the thickness d of the insulating resin layer 220 is greater than or equal to twice the first length h1, a part of the insulating resin layer 220 is pushed between the adjacent second electrodes 510 upon bonding the second substrate 500 to the first substrate 110, and thus the insulating resin layer 220 can flow. When the insulating resin layer 220 flows, the conductive particles 210 in the insulating resin layer 220 can also flow. Accordingly, some of the conductive particles 210 may be pushed between the adjacent second electrodes 510. There is a less number of conductive particles 210 in the first region R1 than in the second region R2. When fewer conductive particles 210 are positioned in the first region R1, the electrical connection between the first electrode 150 and the second electrode 510 might not be secure. In addition, when more conductive particles 210 are positioned in the second region R2, short-circuits can occur between adjacent first electrodes 150 and between adjacent second electrodes 510.

According to an embodiment, when the thickness d of the insulating resin layer 220 is greater than or equal to the first length h1 and less than or equal to twice the first length h1, the insulating resin layer 220 may slightly flow even when the insulating resin layer 220 is pressed when bonding the second substrate 500 to the first substrate 110. Accordingly, the occurrence of short circuit is suppressed, and a capture rate of the conductive particles 210 is improved.

According to an embodiment, the insulating resin layer 220 may include, for example, at least one of polyimide, polyethylene terephthalate, nylon 6, polyvinylidene fluoride, polycarbonate, polybutylene succinate, or polyethylene, however, embodiments of the present disclosure are not limited thereto.

According to an embodiment, a non-conductive film 600 is disposed between the second substrate 500 and the anisotropic conductive film 200 and between adjacent second electrodes 510. The non-conductive film 600 physically connects the second substrate 500 to the first substrate 110. The non-conductive film 600 is formed between the second substrate 500 and the anisotropic conductive film 200 after the second substrate 500 is bonded to the first substrate 110. The non-conductive film 600 is formed in the second region R2. The non-conductive film 600 is formed of an insulating and adhesive material. For example, the non-conductive film 600 includes a thermosetting resin or a photocurable resin. For example, the non-conductive film 600 includes one of an epoxy resin layer, an acrylic resin layer or a polyester resin layer, however, embodiments of the present disclosure are not limited thereto.

In other embodiments, the non-conductive film 600 is formed in the second region R2 after the second substrate 500 is formed. In other words, the non-conductive film 600 is formed on the second substrate 500 before the first substrate 110 and the second substrate 500 are bonded together. In this case, a manufacturing process that separately forms the non-conductive film 600 is omitted. Accordingly, the bonding process between the first substrate 110 and the second substrate 500 is simplified.

When a second substrate is bonded to the rear surface of a first substrate of an existing display device in a related art, the display panel can be damaged due to the bonding pressure. Specifically, since the conductive particles have a spherical shape, a high pressure is applied when the first substrate and the second substrate are bonded to each other so as to ensure a sufficient contact area. The high pressure can damage the display panel, and thus display quality may be deteriorated.

In embodiments according to the present disclosure, the conductive particles 210 have a spherical shape pressed in the first direction D1, so that a lower pressure can be applied to the first substrate 110 and the second substrate 500 when the first substrate 110 is bonded to the second substrate 500. Specifically, the conductive particles 210 have a spherical shape pressed in the first direction D1, so that the first and second flat surfaces 210a and 210b of the conductive particles 210 can contact the first electrode 150 and the second electrode 510, respectively, even with a low applied pressure. The first flat surface 210a is a contact area between each of the first conductive particles 211 and the first electrode 150. In addition, the second flat surface 210b is a contact area between each of the first conductive particles 211 and the second electrode 510. Accordingly, the contact areas between the conductive particles 210 and the first electrode 150 and between the conductive particles 210 and the second electrode 510 can be secured even with low pressure. In addition, low pressure is applied to the first substrate 110 and the second substrate 500 so that the first substrate 110 and the second substrate 500 are not damaged. However, embodiments according to the present disclosure are not limited thereto. In other embodiments, the second substrate 500 may be disposed on the top surface or a side surface of the display panel 100. In this case as well, low pressure is applied to the first substrate 110 and the second substrate 500, so that the first substrate 110 and the second substrate 500 are not damaged.

Figure 7:
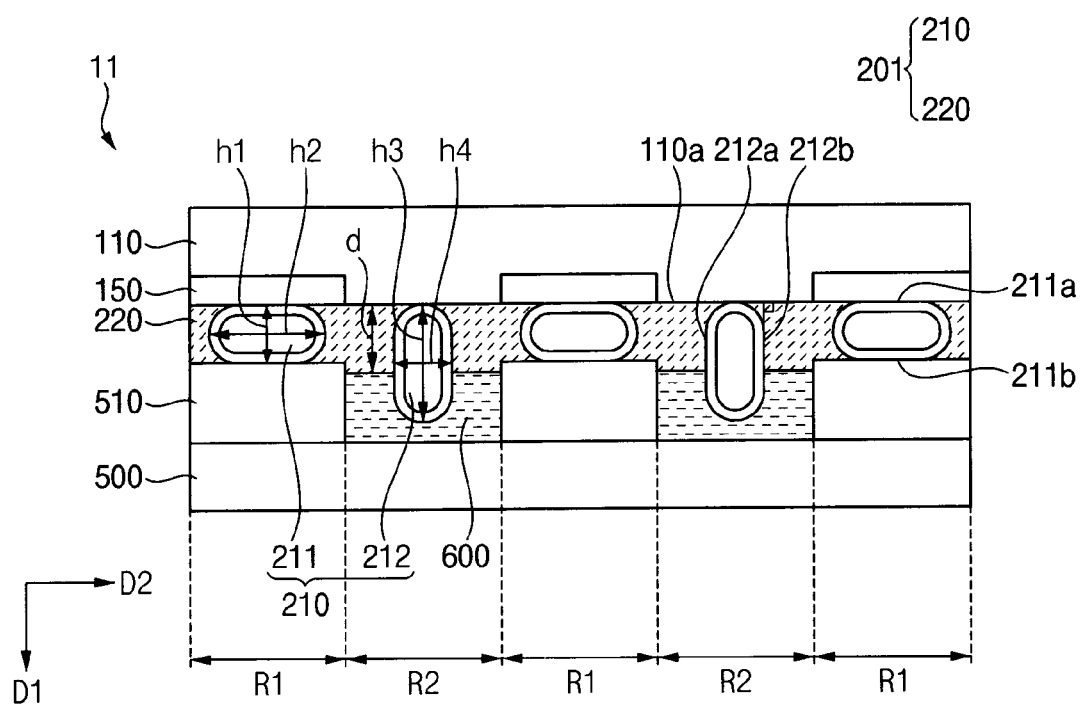
FIG. 7 is a sectional view of a display device according to an embodiment.

FIG. 7 is a sectional view of the display device according to an embodiment of the present disclosure.

In a display device 11 described with reference to FIG. 7, components that are the same as those of the display device 10 that have been described with reference to FIGS. 1 to 6 may not be described below.

Referring to FIG. 7, the display device 11 according to an embodiment include an anisotropic conductive film 201. The anisotropic conductive film 201 includes conductive particles 210 and an insulating resin layer 220. The conductive particles 210 include first conductive particles 211 and second conductive particles 212. The first conductive particles 211 are disposed between the first electrode 150 and the second electrode 510. In other words, the first conductive particles 211 contact with the first electrode 150 and the second electrode 510. A first length h1 of each first conductive particle 211 in the first direction D1 is less than a second length h2 of each first conductive particle 211 in the second direction D2 (and third direction D3) orthogonal to the first direction D1.

According to an embodiment, the second conductive particles 212 do not overlap the first electrode 150 and the second electrode 510. In other words, the second conductive particles 212 are those conductive particles 210 that do not contact the first electrode 150 and the second electrode 510. A third length h3 of each second conductive particle 212 in the first direction D1 is greater than a fourth length h4 of each second conductive particle 212 in the second direction D2 (and third direction D3).

Alternatively, in another embodiment, a plurality of first conductive particles 211 are disposed between the first electrode 150 and the second electrode 510. In addition, a plurality of second conductive particles 212 are disposed between the adjacent first electrodes 150 and between the adjacent second electrodes 510.

Referring to FIGS. 5 and 6, according to an embodiment, each of the conductive particles 210 has a shape of a sphere that was pressed in the first direction D1. Each of the conductive particles 210 includes a first flat surface 210a, a second flat surface 210b that faces the first flat surface 210a, and a curved surface 210c rounded between the first flat surface 210a and the second flat surface 210b. Each of the first and second flat surfaces 210a and 210b has a circular shape. In addition, a sectional shape parallel to the first flat surface 210a of each conductive particle 210 is also circular.

Accordingly, in an embodiment, each of the first conductive particles 211 includes a first flat surface 211a and a second flat surface 211b that faces the first flat surface 211a. Likewise, each of the second conductive particles 212 includes a first flat side (or called a first flat surface) 212a and a second flat side (or called a second flat surface) 212b that faces the first flat side 212a.

According to an embodiment, the first conductive particles 211 receive pressure in a process of bonding the first substrate 110 to the second substrate 500. Accordingly, each of the first conductive particles 211 may be deformed by the applied pressure. Since the pressure is applied in the first direction D1, the first length h1 of each first conductive particle 211 may be less than before the deformation, and the second length h2 may be greater than before the deformation. Since the second conductive particles 212 are not subjected to the pressure, their shapes are maintained. Accordingly, the first length h1 of each first conductive particle 211 is less than the fourth length h4 of each second conductive particle 212. Likewise, the second length h2 of each first conductive particle 211 is greater than the third length h3 of each second conductive particle 212.

According to an embodiment, the second flat side 212b of each second conductive particle 212 forms a right angle with respect to the first surface 110a of the first substrate 110. The first surface 110a of the first substrate 110 is a rear surface in the drawing and is parallel to the second direction D2 and the third direction D3 (see FIG. 1). The first flat side 212a of each second conductive particle 212 also has a right angle with respect to the first surface 110a of the first substrate 110. In other words, each of the second conductive particles 212 are vertically arranged with respect to the first substrate 110, while each of the first conductive particles 211 are horizontally arranged with respect to the first substrate 110.

According to an embodiment, when the anisotropic conductive film 201 is manufactured, the conductive particles 210 are vertically arranged with respect to the first substrate 110. When the first substrate 110 and the second substrate 500 are bonded to each other, the first conductive particles 211 receive a pressure in the first direction D1 and a pressure in the second direction D2 (and third direction D3) that is lower than the pressure in the first direction D1. The first conductive particles 211 subjected to the pressures rotate to be horizontally arranged between the first electrode 150 and the second electrode 510. In other words, the first flat surface 211a and the second flat surface 211b are arranged parallel to the first surface 110a of the first substrate 110. In contrast, the second conductive particles 212 are not subjected to the pressures. Accordingly, the first flat side 212a and the second flat side 212b of each second conductive particle 212 remain vertically arranged with the first surface 110a of the first substrate 110.

According to an embodiment, the thickness d of the insulating resin layer 220 is greater than or equal to the first length h1 of each first conductive particle 211, and less than or equal to twice the third length h3 of each second conductive particle 212.

According to an embodiment, when the thickness d of the insulating resin layer 220 is less than the first length h1, the insulating resin layer 220 might not contact with the second electrode 510 or the first substrate 110. In this case, the electrical connection between the first substrate 110 and the second substrate 500 is not securely formed. In addition, when the thickness d of the insulating resin layer 220 is less than the first length h1 of each conductive particle 210, a part of each conductive particle 210 in the insulating resin layer 220 may be reduced in size. Accordingly, the conductive particles 210 might not be fixed in the insulating resin layer 220.

According to an embodiment, when the thickness d of the insulating resin layer 220 is greater than or equal to twice the third length h3, the insulating resin layer 220 can flow upon bonding the second substrate 500 to the first substrate 110, so that a part of the insulating resin layer 220 can flow between the adjacent second electrodes 510. When the insulating resin layer 220 flows, the conductive particles 210 in the insulating resin layer 220 can also flow. Accordingly, some of the conductive particles 210 can be pushed between the adjacent second electrodes 510. There is a less number of conductive particles 210 in the first region R1 than in the second region R2. When fewer conductive particles 210 are positioned in the first region R1, the electrical connection between the first electrode 150 and the second electrode 510 might not be secure. In addition, when a larger number of conductive particles 210 are positioned in the second region R2, short-circuits can occur between adjacent first electrodes 150 and between adjacent second electrodes 510.

According to an embodiment, when the thickness d of the insulating resin layer 220 is greater than or equal to the first length h1 and less than or equal to twice the third length h3, the insulating resin layer 220 can slightly flow even when the insulating resin layer 220 is pressed upon bonding the second substrate 500 to the first substrate 110. Accordingly, the occurrence of short circuit can be suppressed, and a capture rate of the conductive particles 210 is improved.

According to an embodiment, the pressed first conductive particles 211 and second conductive particles 212 are arranged and fixed in the insulating resin layer 220, to obtain large contact areas of the first conductive particles 211 upon bonding the second substrate 500 to the first substrate 110. The large contact areas are ensured to secure the electrical connection between the first substrate 110 and the second substrate 500. In addition, a distance between the second conductive particles 212 and adjacent first electrodes 150 and second electrodes 510 is ensured. Accordingly, a short-circuit between the first electrodes 150 adjacent to the second conductive particles 212 and between the second electrodes 510 adjacent to the second conductive particles 212 are prevented.

Figure 8:
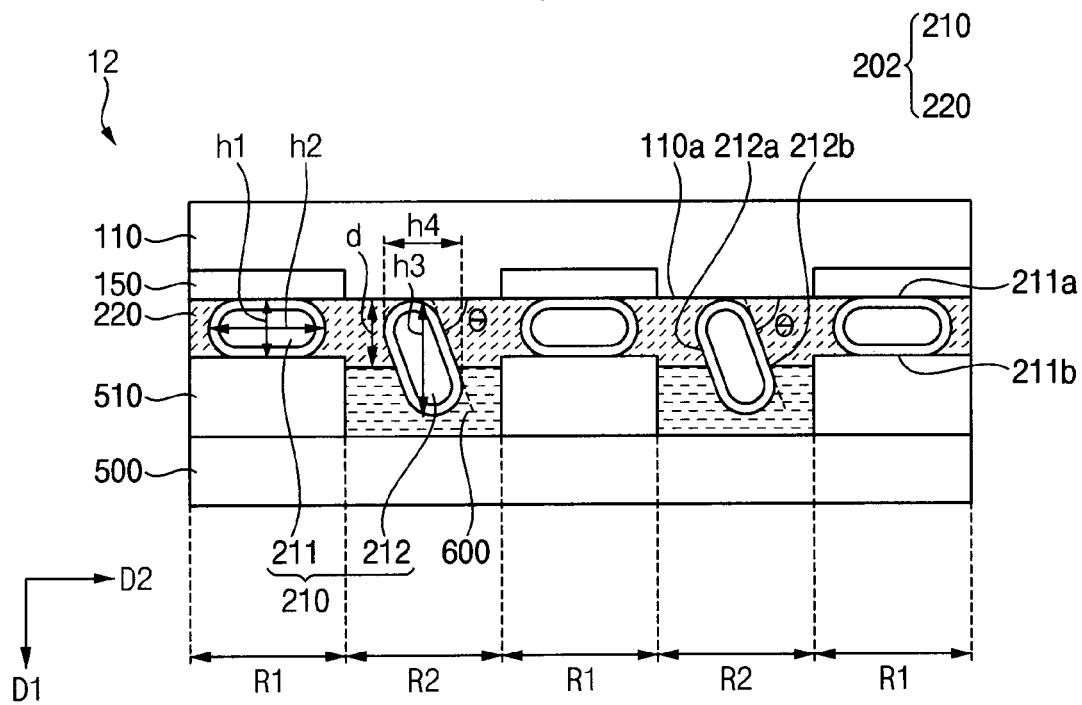
FIG. 8 is a sectional view of a display device according to an embodiment.

FIG. 8 is a sectional view showing the display device according to an embodiment of the present disclosure.

In a display device 12 described with reference to FIG. 8, components that are the same as those of the display device 11 that have been described with reference to FIG. 7 may not be described below.

Referring to FIG. 8, the display device 12 according to an embodiment includes an anisotropic conductive film 202. The anisotropic conductive film 202 includes conductive particles 210 and an insulating resin layer 220. The conductive particles 210 include first conductive particles 211 and second conductive particles 212. The first conductive particles 211 are disposed between the first electrode 150 and the second electrode 510. In other words, the first conductive particles 211 contact the first electrode 150 and the second electrode 510. A first length h1 of each of the first conductive particles 211 in the first direction D1, which is a direction from the first substrate 110 to the second substrate 500, is less than a second length h2 of each first conductive particle 211 in the second direction D2 (and third direction D3) orthogonal to the first direction D1.

According to an embodiment, the second conductive particles 212 do not overlap the first electrode 150 and the second electrode 510. In other words, the second conductive particles 212 are those conductive particles 210 that do not contact the first electrode 150 and the second electrode 510. The third length h3 of each second conductive particle 212 in the first direction D1 is greater than the fourth length h4 of each second conductive particle 212 in the second direction D2 (and third direction D3).

Referring to FIGS. 5 and 6, each of the conductive particles 210 has a shape of a sphere that was pressed in the first direction D1. Each of the conductive particles 210 includes a first flat surface 210a, a second flat surface 210b that faces the first flat surface 210a, and a curved surface 210c rounded between the first flat surface 210a and the second flat surface 210b.

Accordingly, in an embodiment, each of the first conductive particles 211 includes a first flat surface 211a and a second flat surface 211b that faces the first flat surface 211a. Likewise, each of the second conductive particles 212 includes a first flat side (or called a first flat surface) 212a and a second flat side (or called a second flat surface) 212b that faces the first flat side 212a.

In an embodiment, the second flat side 212b of each second conductive particle 212 forms an angle θ of greater than about 45 degrees and less than about 90 degrees with respect to the first surface 110a of the first substrate 110. The first flat side 212a of each second conductive particle 212 also forms the same angle θ as the second flat side 212b with respect to the first surface 110a of the first substrate 110.

In an embodiment, when the anisotropic conductive film 202 is manufactured, the conductive particles 210 are arranged in a state that is inclined at a predetermined angle θ with respect to the first substrate 110. When the first substrate 110 and the second substrate 500 are bonded to each other, the first conductive particles 211 receive a pressure in the first direction D1. The first conductive particles 211 subjected to the pressure become horizontally arranged between the first electrode 150 and the second electrode 510. In other words, the first flat surface 211a and the second flat surface 211b are arranged parallel to the second substrate 500. Unlike the display device 11 of FIG. 7, the conductive particles 210 of the display device 12 of FIG. 8 are initially inclined at the predetermined angle θ with respect to the first surface 110a of the first substrate 110, so no pressure is required in the second direction D2 (and third direction D3). In other words, even though the first conductive particles 211 are not subjected to pressure in the second direction D2 (and third direction D3), the first flat surface 211a and the second flat surface 211b of the first conductive particles 211 are repositioned to be parallel with the second substrate 500 by the pressure in the first direction D1. On the other hand, the second conductive particles 212 are not subject to the above pressure. Accordingly, the first flat side 212a and the second flat side 212b of each second conductive particles 212 remain inclined at the predetermined angle θ with respect to the first substrate 110.

Accordingly, in an embodiment, large contact areas are ensured between the conductive particles 210 and the first electrode 150 and the second electrode 510, so that a secure electrical connection is formed between the first substrate 110 and the second substrate 500. In addition, a separation between the second conductive particles 212 and the first electrodes 150 and the second electrodes 510 adjacent to the second conductive particles 212 is ensured. Accordingly, short-circuits between the first electrodes 150 adjacent to the second conductive particles 212 and between the second electrodes 510 adjacent to the second conductive particles 212 can be prevented.

FIGS. 9 to 19 illustrate a method of manufacturing a display device according to an embodiment of the present disclosure.

In the display device 10 described with reference to FIGS. 9 to 19, components that are the same as those of the display device 10 that have been described above with reference to FIGS. 1 to 6 may not be described below.

Figure 9:
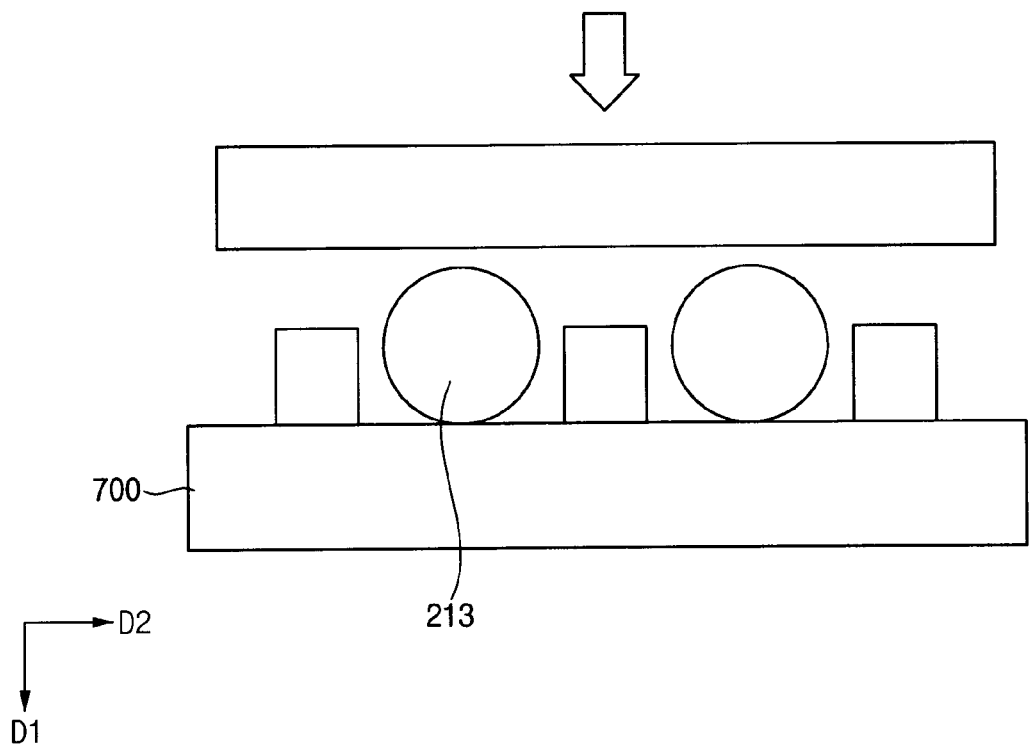
FIGS. 9 to 19 illustrate a method of manufacturing a display device according to an embodiment of the present disclosure.
Figure 10:
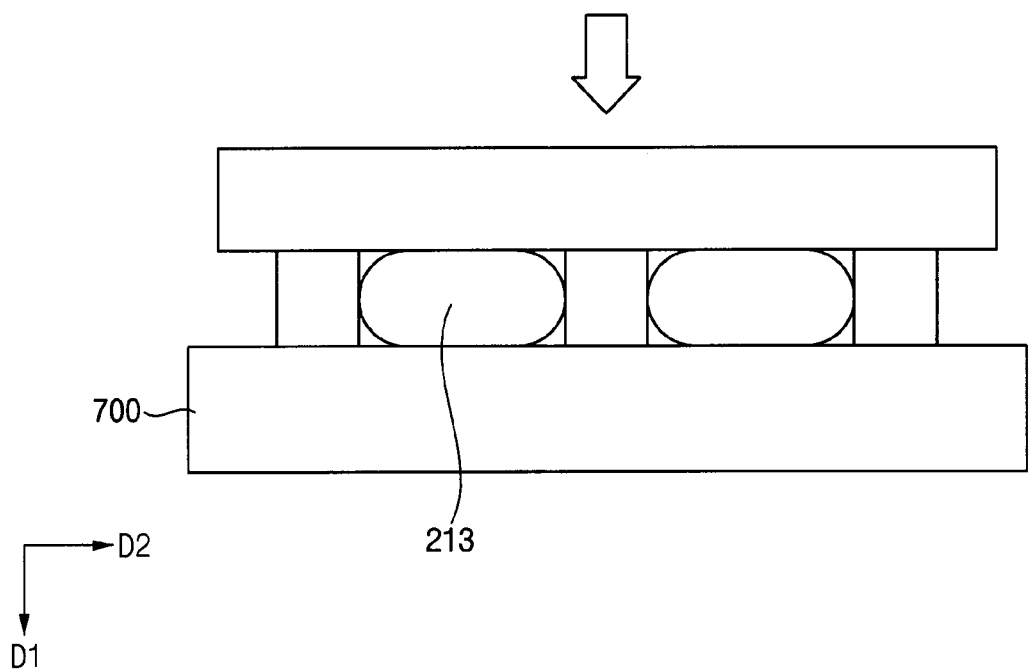

Referring to FIGS. 9 and 10, in an embodiment, polymer beads 213 are disposed on a first jig 700. Each of the polymer beads 213 has a spherical shape. A heating and pressing device applies heat and pressure to the spherical polymer beads 213 disposed on the first jig 700. After being subjected to the heat and the pressure, each of the polymer beads 213 has a circular plate shape. Specifically, the spherical polymer beads 213 have a shape of a spherical plate, that is, a circular plate pressed after receiving pressure in the first direction D1 and then receiving heat. Accordingly, a length of a short axis of each polymer bead 213 is less than a length of a long axis perpendicular to the short axis. The polymer beads 213 are formed of thermoplastic resin. The thermoplastic resin, for example, includes at least one of polyethylene, nylon, polyacetyl resin, vinyl chloride resin, polystyrene, ABS resin, or acrylic resin.

Figure 11:
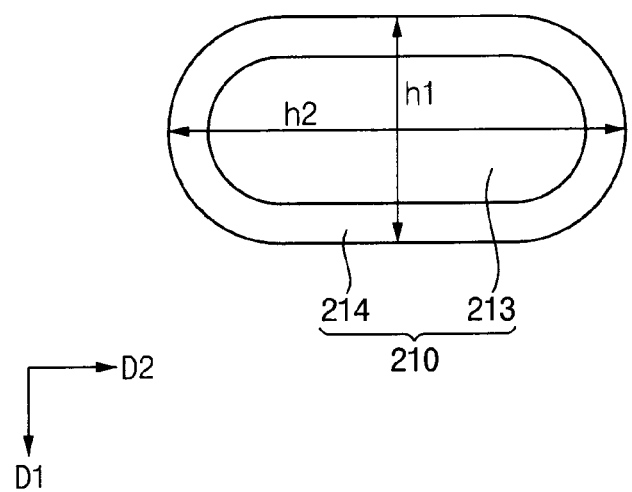
Figure 12:
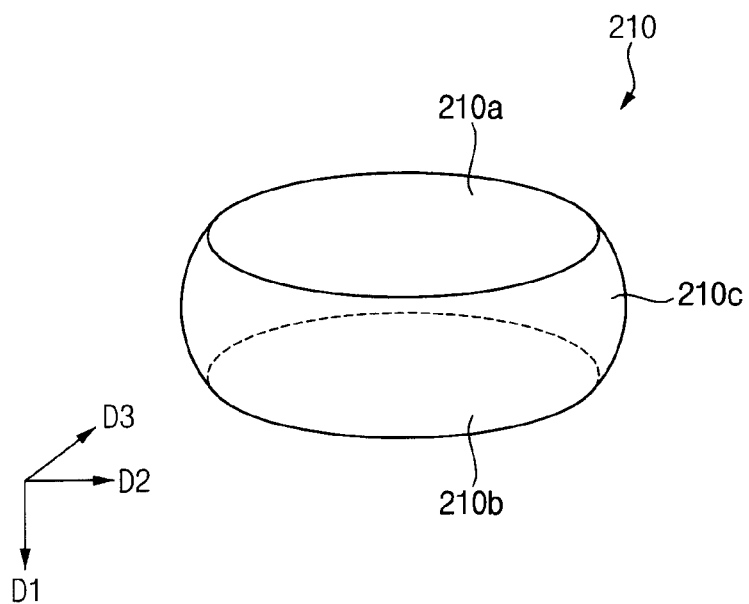

Referring to FIG. 11, in an embodiment, metal is plated onto surfaces of the polymer beads 213. The metal, for example, includes at least one of nickel, cobalt, gold, silver, or copper, etc. The conductive particles 210 are formed by forming a coating layer 214 including metal on the surface of the polymer bead 213. The coating layer 214 may be formed by processes such as electroless plating, electroplating, physical vapor deposition, or paste coating, however, embodiments of the present disclosure are not limited thereto. Referring further to FIG. 12, each of the conductive particles 210 has a spherical shape pressed in the first direction D1. Each of the conductive particles 210 includes a first flat surface 210a, a second flat surface 210b that faces the first flat surface 210a, and a curved surface 210c rounded between the first flat surface 210a and the second flat surface 210b. Each of the first and second flat surfaces 210a and 210b has a circular shape in a plan view. In addition, a sectional shape parallel to the first flat surface 210a of each conductive particle 210 is also circular.

In an embodiment, like the polymer beads 213, each of the conductive particles 210 has a length h1 along a short axis that is less than a length h2 along a long axis orthogonal to the short axis. The short axis of each of the conductive particles 210 is the axis of the shortest distance between the first flat surface 210a and the second flat surface 210b. The long axis of each of the conductive particles 210 corresponds to a diameter of the largest circle of sections orthogonal to the short axis.

Figure 13:
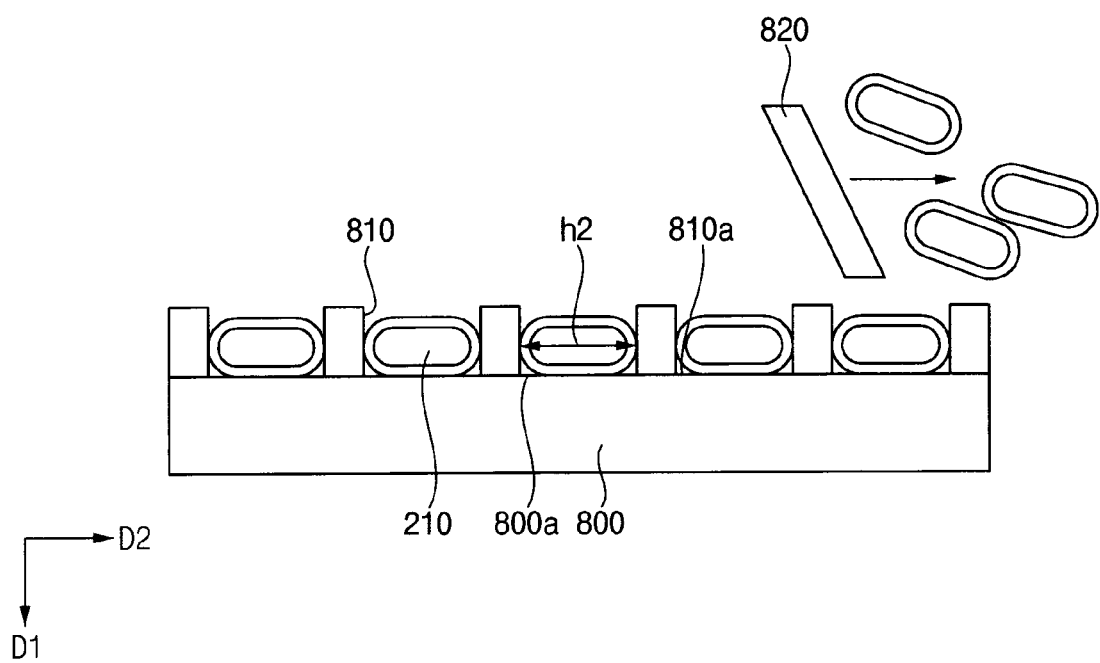

Referring to FIG. 13, in an embodiment, a second jig 800 that includes a plurality of grooves 810 is provided. The conductive particles 210 are disposed on the second jig 800. The conductive particles 210 are disposed on the second jig 800 while being dispersed in a dispersion. The dispersion, for example, includes a binder liquid.

In an embodiment, the conductive particles 210 fill a groove 810 of the second jig 800. The conductive particles 210 are filled into the groove 810 by using a blade 820. The conductive particles 210 are pushed into the groove 810 by the blade 820, so that the conductive particles 210 fill the groove 810. A length of a bottom surface 810a of the groove 810 is greater than or equal to the second length h2 of each conductive particle 210 to accommodate the conductive particles 210. When the blade 820 is used, the second flat surfaces 210b of the conductive particles 210 are arranged parallel to the bottom surface 810a of each groove 810. In other words, the long axis of each conductive particle 210 is arranged parallel to the first surface 800a of the second jig 800, and the short axis of each conductive particle 210 is arranged perpendicular to the first surface 800a of the second jig 800 on the second jig 800.

Figure 14:
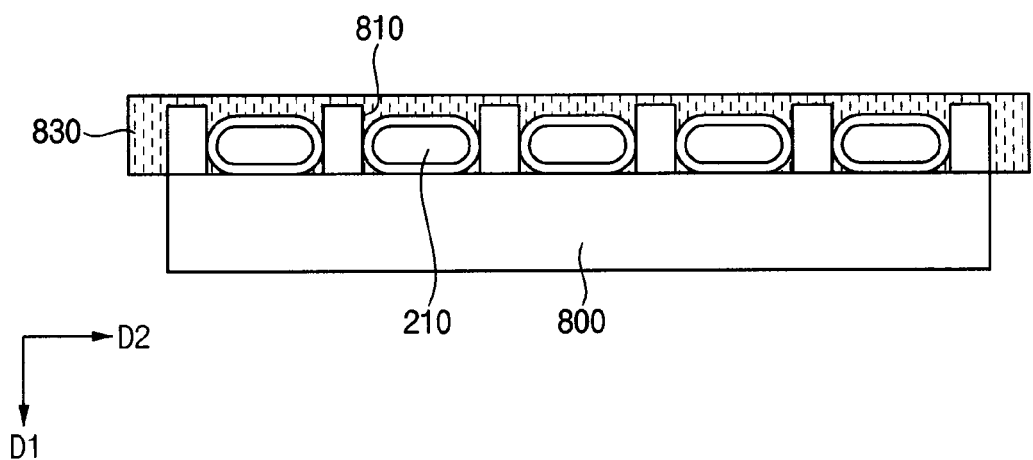
Figure 15:
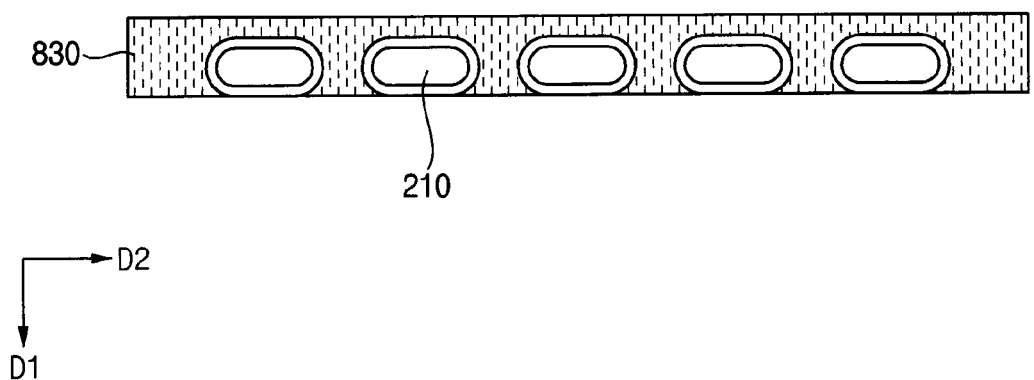

Referring to FIGS. 14 and 15, in an embodiment, an uncured resin layer 830 is disposed on the second jig 800 and the conductive particles 210. After the uncured resin layer 830 is disposed, the second jig 800 is removed from the uncured resin layer 830 and the conductive particles 210. After the second jig 800 has been removed, spaces are formed that were previously occupied by barriers between the grooves 810, and the uncured resin layer 830 flows into these spaces between the conductive particles 210. The uncured resin layer 830, for example, includes at least one of polyimide, polyethylene terephthalate, nylon 6, polyvinylidene fluoride, polycarbonate, polybutylene succinate, or polyethylene, however, embodiments of the present disclosure are not limited thereto.

Figure 16:
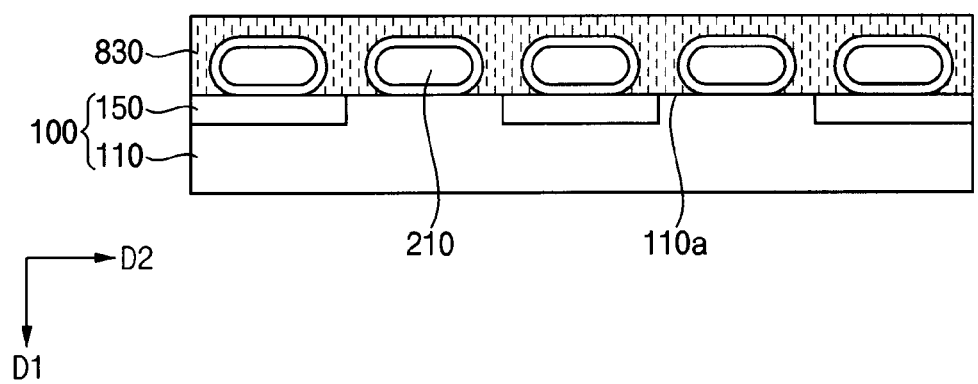

Referring to FIG. 16, in an embodiment, the display panel 100 with the first substrate 110 is provided. The first substrate 110 includes a first electrode 150. Although the first electrode 150 is shown in the drawings as being embedded in the first substrate 110, the first electrode 150 may protrude from a lower surface of the first substrate 110. The uncured resin layer 830 formed around the conductive particles 210 is disposed on the first substrate 110. The long axis of each conductive particle 210 is parallel to the first surface 110a of the first substrate 110. The short axis of each conductive particle 210 orthogonal to the long axis is perpendicular to the first surface 110a of the first substrate 110.

Figure 17:
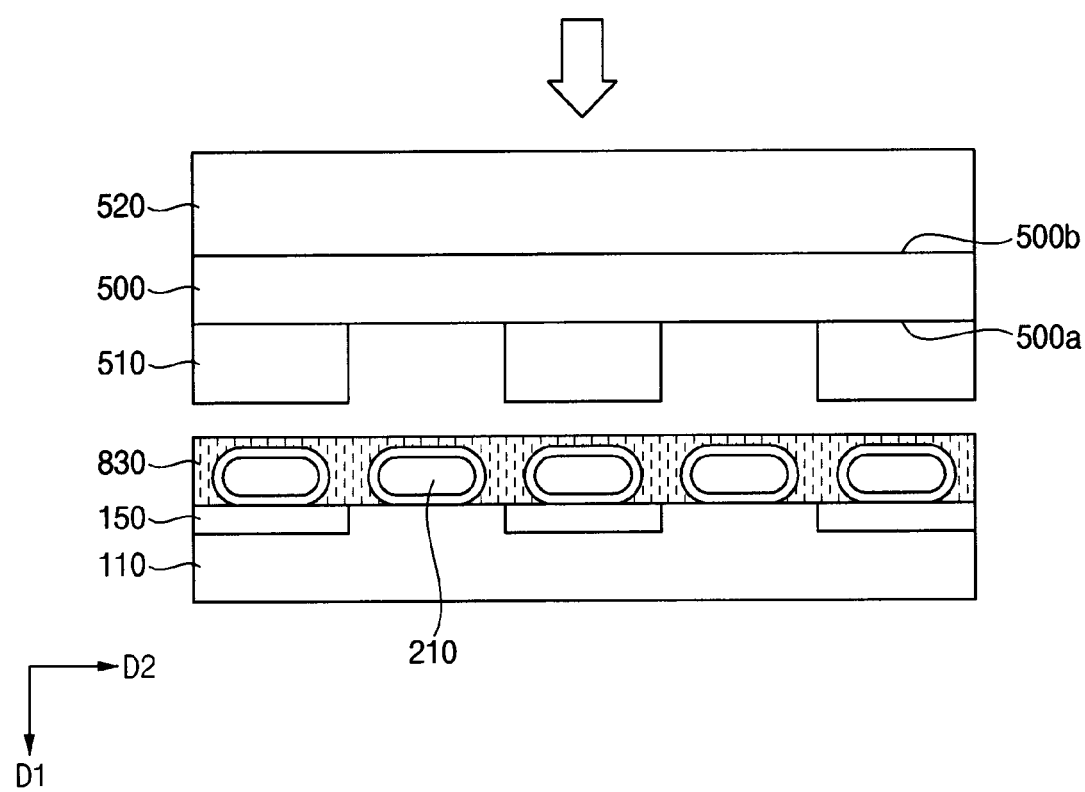
Figure 18:
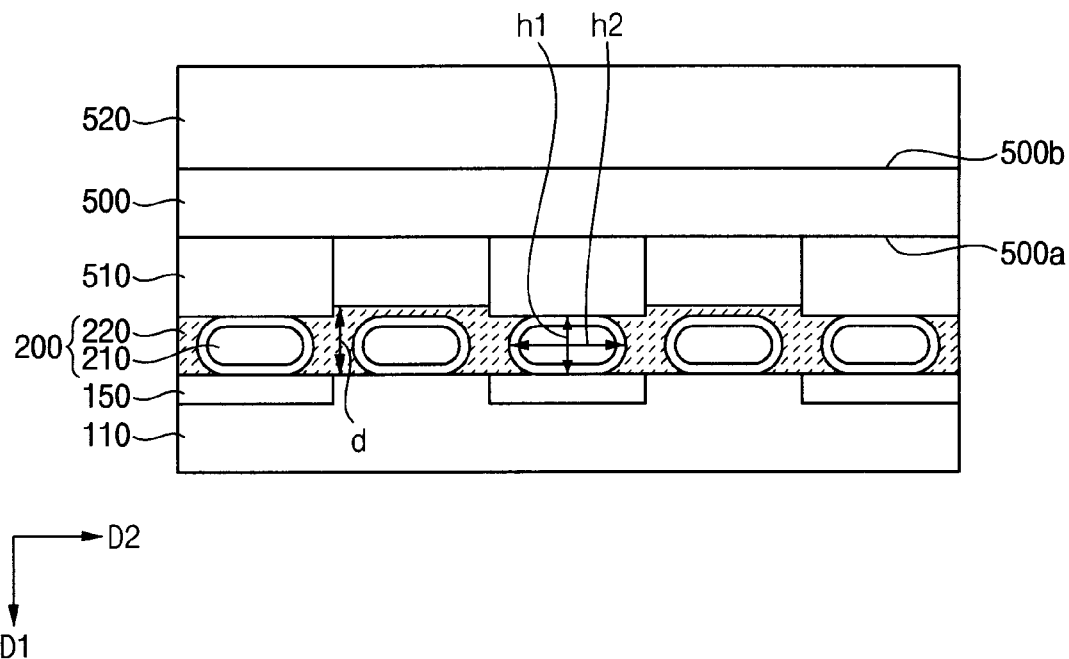

Referring to FIGS. 17 and 18, in an embodiment, a high temperature tool 520, a second substrate 500, and a second electrode 510 attached to a first surface 500a of the second substrate 500 are provided. The high temperature tool 520 contacts a second surface 500b of the second substrate 500 that faces the first surface 500a of the second substrate 500. The high temperature tool 520 transfers heat to the second substrate 500 and the second electrode 510. The second substrate 500 may receives pressure in the first direction D1. Accordingly, the second electrode 510 applies pressure to the uncured resin layer 830 and the conductive particles 210. The second substrate 500 receives the pressure in the first direction D1 until the second electrode 510 and the first electrode 150 come into contact with the conductive particles 210. When the second electrode 510 and the first electrode 150 come into contact with the conductive particles 210, heat is transferred from the high-temperature tool 520 to the uncured resin layer 830 through the second substrate 500 and the second electrode 510. When the heat is transferred to the uncured resin layer 830, the uncured resin layer 830 is cured to form the insulating resin layer 220. However, a process of curing the uncured resin layer 830 is not limited thereto. The insulating resin layer 220 is fixed in a cured state so as to fix the shape and position of the conductive particles 210. As a result, the cured insulating resin layer 220 fixes the conductive particles 210 to form the anisotropic conductive film 200.

In an embodiment, the thickness d of the insulating resin layer 220 is greater than or equal to the length h1 of the short axis of each of the conductive particles 210. The thickness d of the insulating resin layer 220 is less than or equal to twice the length h1 of the short axis of each of the conductive particles 210. When the thickness d of the insulating resin layer 220 is greater than or equal to the length h1 of the short axis and less than or equal to twice the length h1 of the short axis, the insulating resin layer 220 can slightly flow even when the insulating resin layer 220 is pressed when bonding the second substrate 500 to the first substrate 110. Accordingly, the occurrence of a short circuit is suppressed, and a capture rate of the conductive particles 210 is improved.

Figure 19:
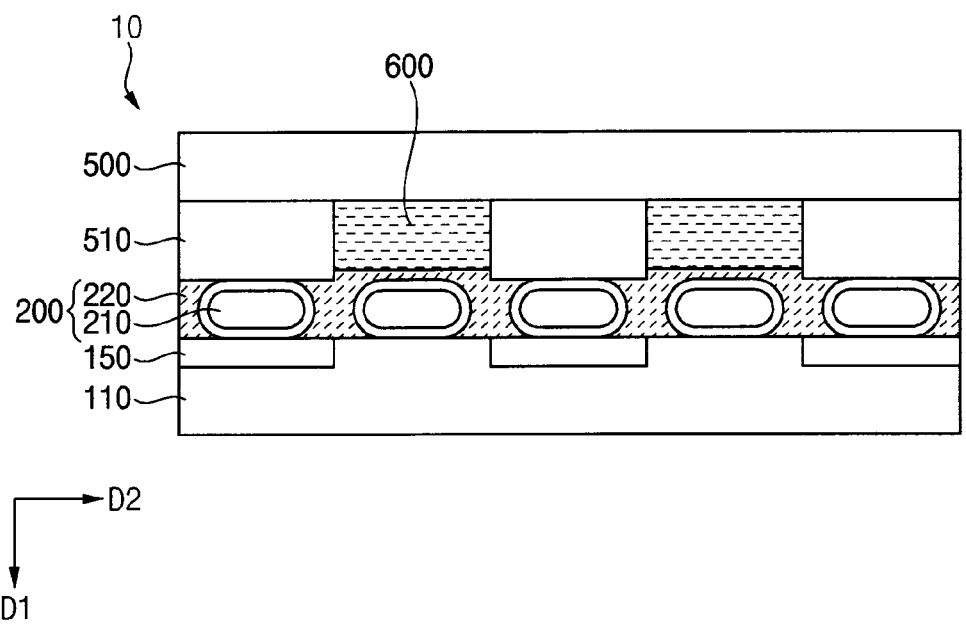

Referring to FIGS. 18 and 19, in an embodiment, the high-temperature tool 520 is removed after the insulating resin layer 220 is cured to bond the first substrate 110 and the second substrate 500 to each other. In addition, when the first substrate 110 and the second substrate 500 are bonded to each other, an empty space may be created between the second substrate 500 and the insulating resin layer 220. Specifically, an empty space may be created between the second electrodes 510. A non-conductive film 600 is formed in the empty space between the second substrate 500 and the anisotropic conductive film 200. In an embodiment, the non-conductive film 600 is formed in the empty space between the second substrate 500 and the anisotropic conductive film 200 by using a capillary phenomenon. However, embodiments according to the present disclosure are not limited thereto. In other embodiments, the non-conductive film 600 is formed in advance on the second substrate 500 before the second substrate 500 is bonded to the first substrate 110. In other words, the second substrate 500 and the first substrate 110 are bonded to each other after the non-conductive film 600 is formed on the second substrate 500. Accordingly, when the second substrate 500 is bonded to the first substrate 110, the non-conductive film 600 and the anisotropic conductive film 200 are also bonded to each other. In this case, since no additional process is necessary to form the non-conductive film 600, the manufacturing process of the display device 10 is simplified.

FIGS. 20 to 30 are sectional views that illustrate a method of manufacturing the display device according to an embodiment of the present disclosure.

In the display device 11 described with reference to FIGS. 20 to 30, steps that are the same as those described with reference to the method of manufacturing the display device 10 of FIGS. 9 to 19 will not be described below.

Figure 20:
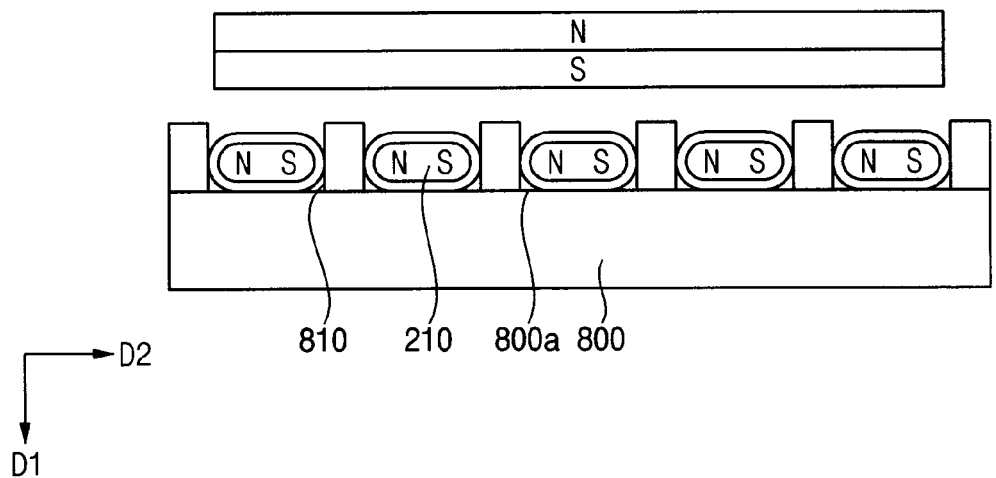
FIGS. 20 to 30 are sectional views that illustrate a method of manufacturing a display device according to an embodiment.
Figure 21:
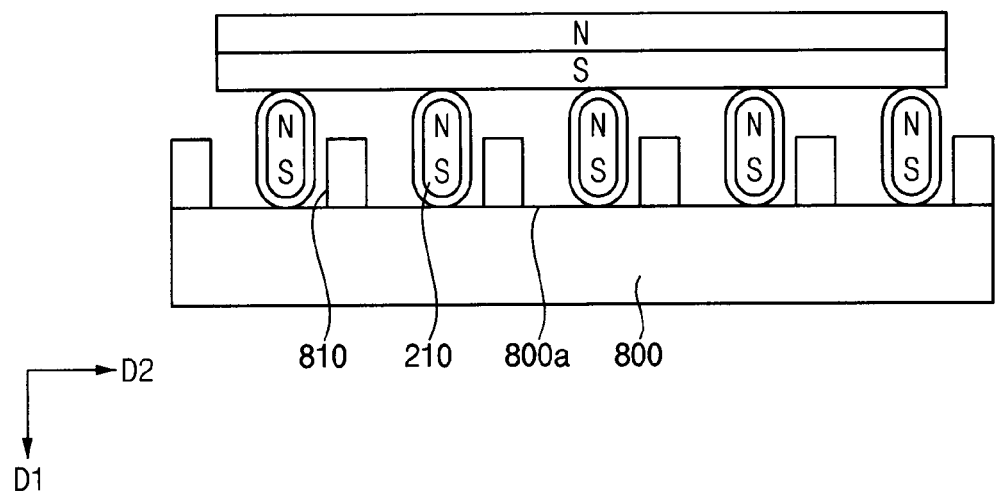

Referring to FIGS. 20 and 21, in an embodiment, a second jig 800 that includes a plurality of grooves 810 is provided. The conductive particles 210 are filled into the groove 810 of the second jig 800. Thereafter, the filled conductive particles 210 are magnetized. However, in other embodiments, the conductive particles 210 are magnetized in advance, and then the magnetized conductive particles 210 are filled in the second jig 800. An external magnetic field is applied to the magnetized conductive particles 210. The conductive particles 210 are vertically arranged with respect to the first surface 800a of the second jig 800 by the external magnetic field. In other words, the external magnetic field is applied the conductive particles 210 rotate so that the short axis of each of the conductive particles 210 is aligned parallel with the first surface 800a of the second jig 800.

Figure 22:
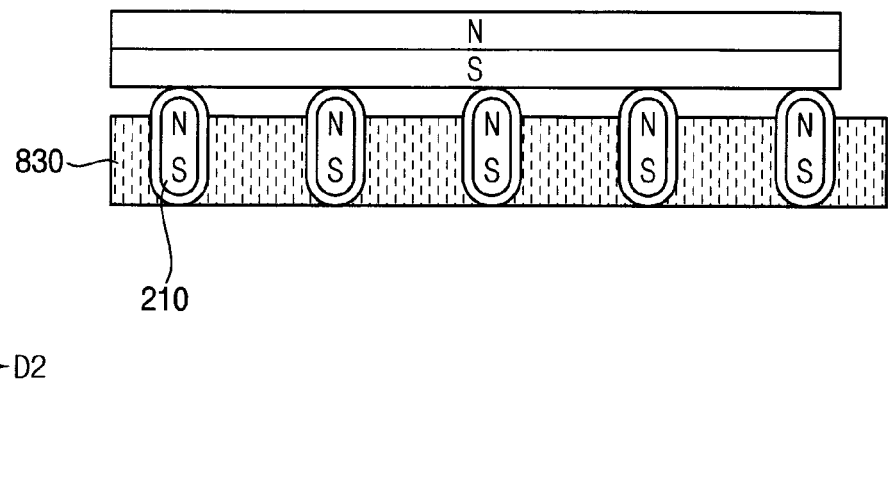
Figure 23:
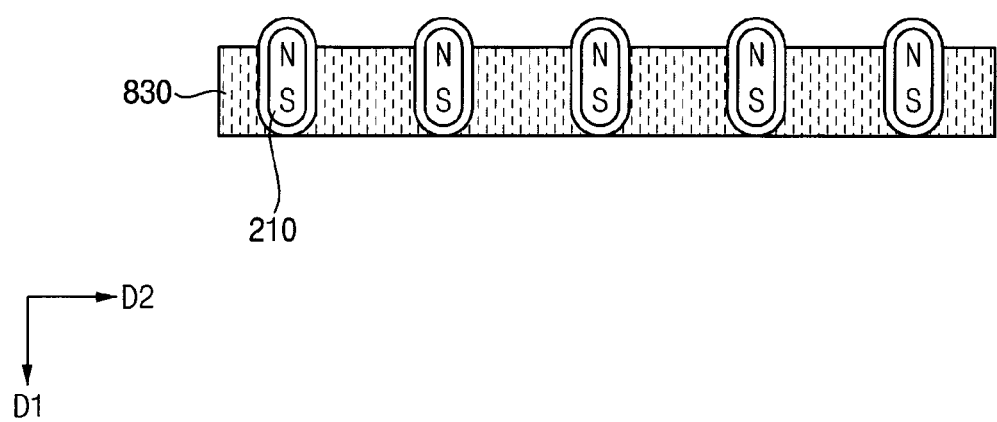
Figure 24:
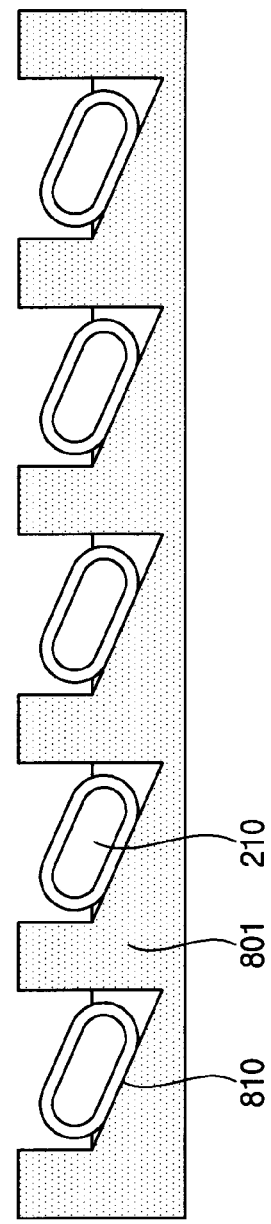

Referring to FIGS. 22 and 23, in an embodiment, the second jig 800 is removed, and then the uncured resin layer 830 is applied onto the conductive particles 210 arranged by the external magnetic field. After the uncured resin layer 830 is applied, the external magnetic field is removed.

Figure 25:
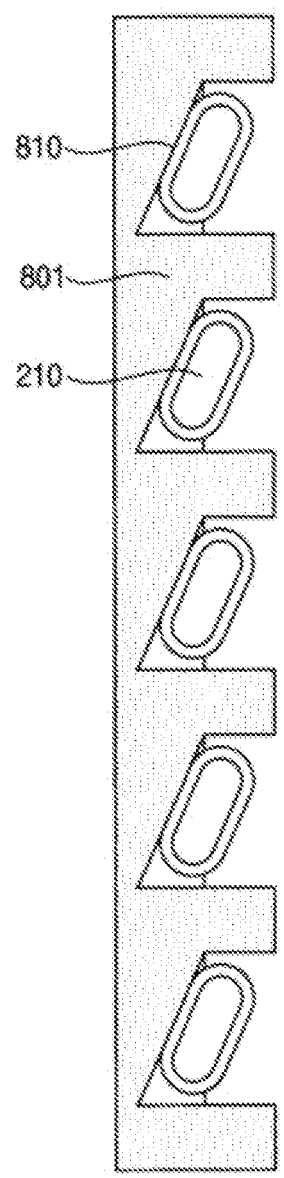
Figure 26:
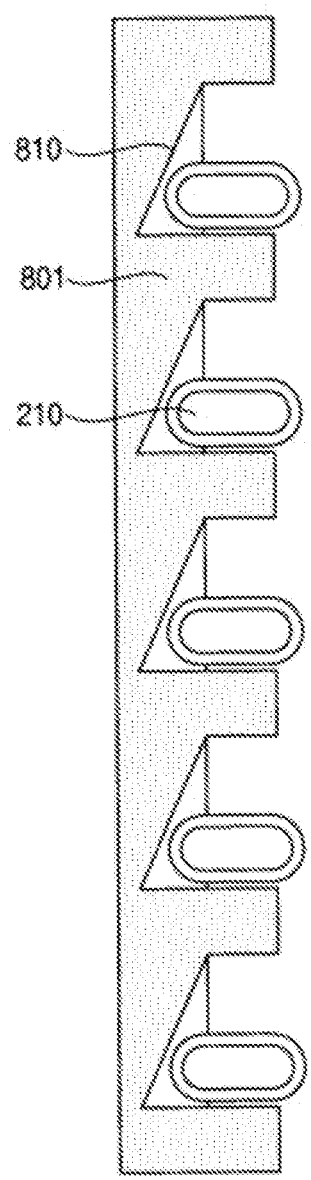
Figure 27:
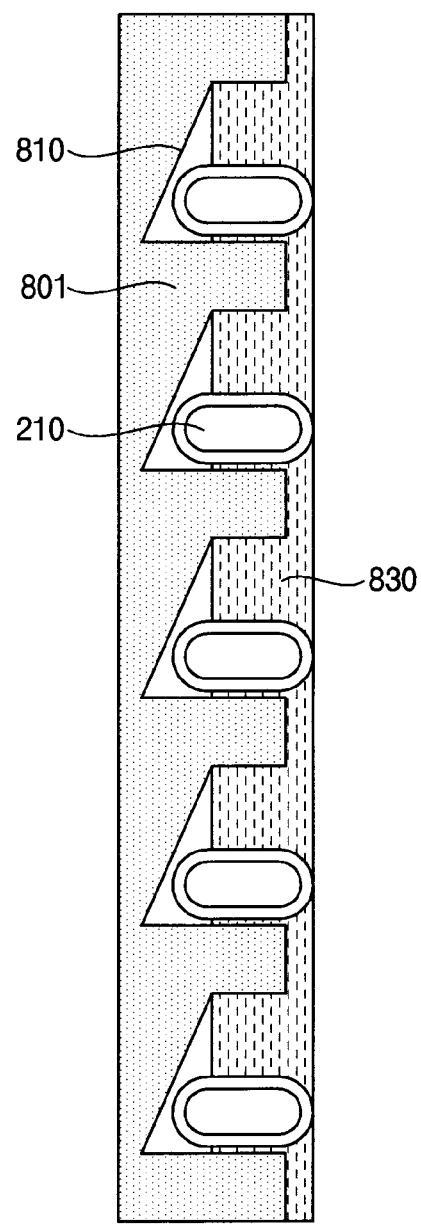
Figure 28:
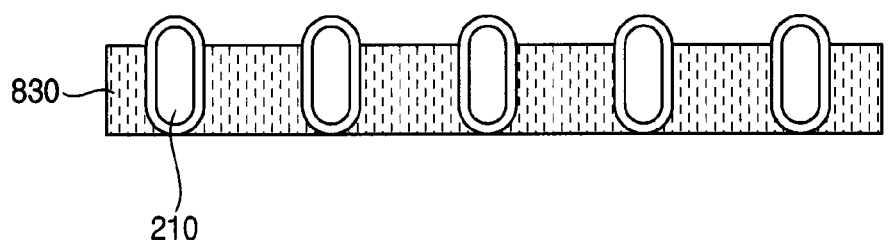

Referring to FIGS. 24 to 28, in a method of manufacturing the display device 11 according to an embodiment, the bottom surface of the groove 810 is formed in the second jig 801 to be inclined. Referring to FIGS. 25 and 26, after the conductive particles 210 are disposed in the groove 810, the second jig 801 is tilted such that the short axes of the conductive particles 210 are arranged in a line. Referring to FIG. 27, thereafter, the uncured resin layer 830 is applied onto the conductive particles 210 and the second jig 801. Referring to FIG. 28, after the uncured resin layer 830 is applied on the conductive particles 210, the second jig 801 may be removed.

Figure 29:
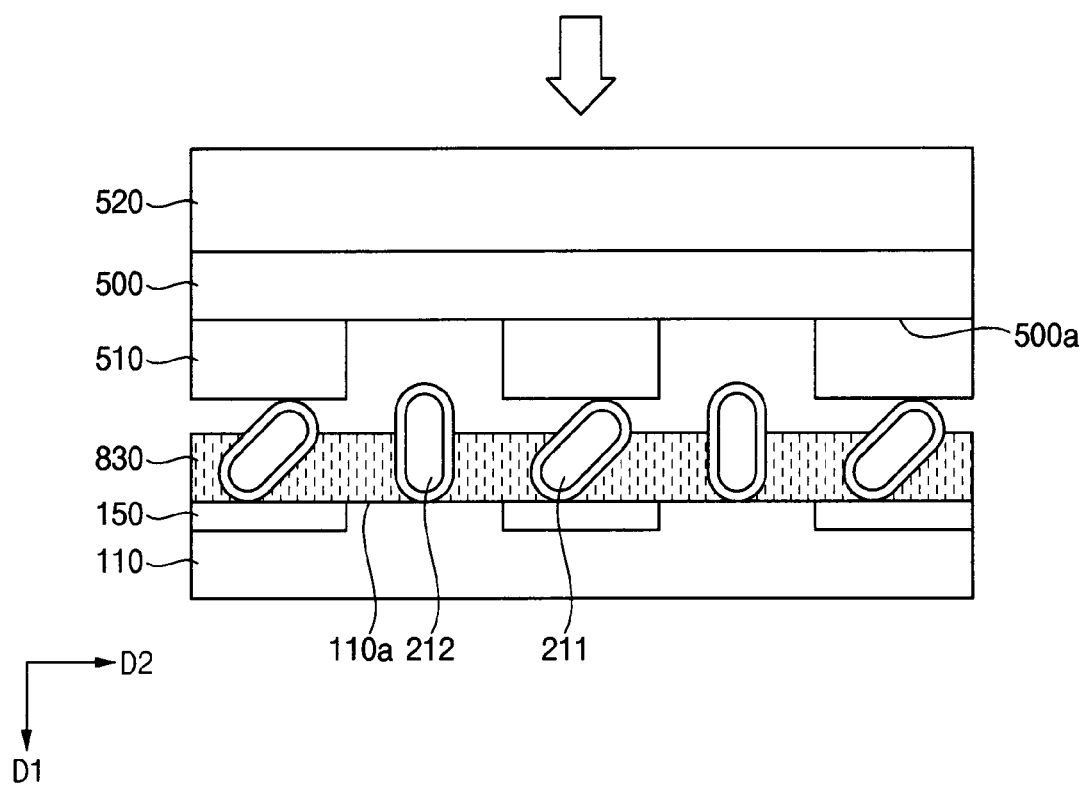
Figure 30:
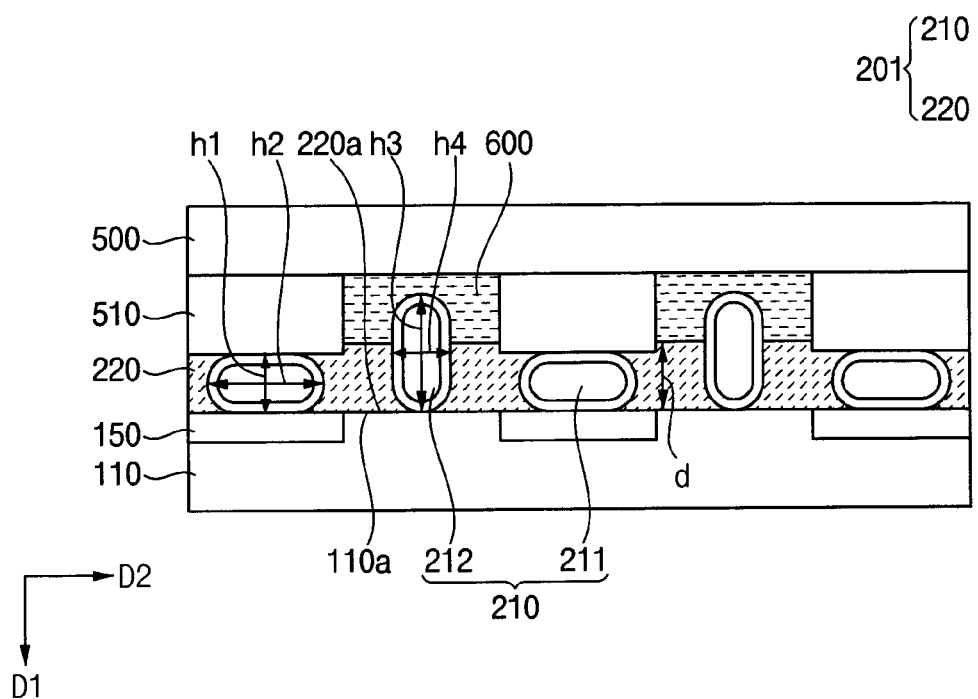

Referring to FIGS. 29 and 30, in an embodiment, a first substrate 110 that includes a first electrode 150, a high temperature tool 520, a second substrate 500, and a second electrode 510 attached to a first surface 500a of the second substrate 500, are provided. Although the first electrode 150 is shown in the drawings as being embedded in the first substrate 110, the first electrode 150 may protrude from a lower surface of the first substrate 110. The uncured resin layer 830 with the conductive particles 210 is disposed on the first substrate 110. The short axis of each conductive particle 210 is parallel to the first surface 110a of the first substrate 110. The long axis of each conductive particle 210 orthogonal to the short axis is perpendicular to the first surface 110a of the first substrate 110.

In an embodiment, the second substrate 500 is pressed in the first direction D1 and the second direction D2 (and third direction D3). The pressure in the second direction D2 (and third direction D3) is lower than the pressure in the first direction D1. The conductive particles 210 disposed between the first electrode 150 and the second electrode 510 are referred to as first conductive particles 211. The conductive particles 210 other than the first conductive particles 211 are referred to as second conductive particles 212. The first conductive particles 211 are subject to the pressures and the second conductive particles 212 are not subject to the pressures. The first conductive particles 211 subjected to pressure contact the first electrode 150 and the second electrode 510. Accordingly, the long axis of each first conductive particle 211 becomes parallel to the first surface 110a of the first substrate 110, and the short axis of each first conductive particle 211 becomes perpendicular to the first surface 110a of the first substrate 110. Accordingly, large contact areas of the first conductive particles 211 are ensured. On the other hand, the second conductive particles 212 are not subject to pressure. Accordingly, the long axis of each second conductive particle 212 remains vertically aligned with the first surface 110a of the first substrate 110. The short axis of each second conductive particle 212 remains parallel to the first surface 110a of the first substrate 110.

In an embodiment, the high temperature tool 520 applies heat and pressure to the conductive particles 210 and the uncured resin layer 830. Accordingly, the uncured resin layer 830 is cured to become the insulating resin layer 220, and the anisotropic conductive film 201 with the conductive particles 210 is formed.

In an embodiment, the thickness d of the insulating resin layer 220 is greater than or equal to the length h1 of the short axis of each first conductive particle 211, and less than or equal to twice the length h3 of the long axis of each second conductive particle 212. When the thickness d of the insulating resin layer 220 is greater than or equal to the length h1 of the short axis and less than or equal to twice the length h3 of the long axis, the insulating resin layer 220 can slightly flow even when the insulating resin layer 220 is pressed when bonding the second substrate 500 to the first substrate 110. Accordingly, the occurrence of short circuit is suppressed, and a capture rate of the conductive particles 210 is improved.

In an embodiment, the pressed first conductive particles 211 and second conductive particles 212 are arranged and fixed in the insulating resin layer 220, to obtain large contact areas of the first conductive particles 211 upon bonding the second substrate 500 to the first substrate 110. The large contact areas are ensured to provide a secure electrical connection between the first substrate 110 and the second substrate 500. In addition, a distance between the second conductive particles 212 and the first electrodes 150 and the second electrodes 510 adjacent to the second conductive particles 212 is ensured. Accordingly, short-circuits between the first electrodes 150 adjacent to the second conductive particles 212 and between the second electrodes 510 adjacent to the second conductive particles 212 can be prevented.

Figure 31:
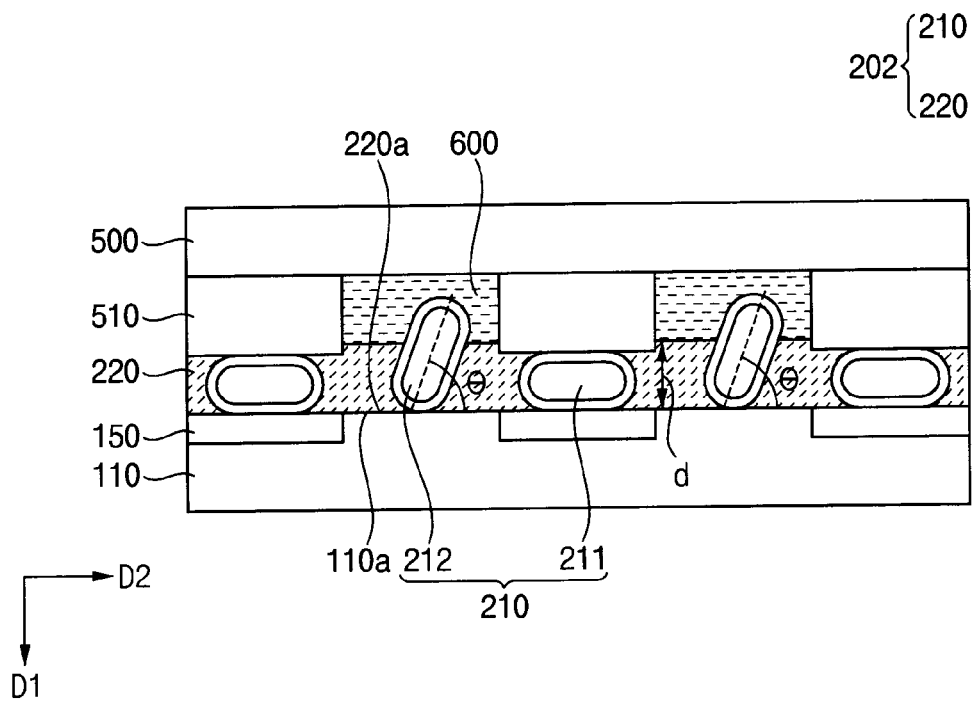
FIG. 31 is a sectional view that illustrates a method of manufacturing a display device according to an embodiment of the present disclosure.

FIG. 31 is a sectional view that illustrates a method of manufacturing a display device according to an embodiment of the present disclosure.

Referring to FIG. 31, in an embodiment, the conductive particles 210 are arranged at a predetermined angle θ with respect to the first surface 110a of the first substrate 110. The second substrate 500 receives pressure in the first direction D1. The first conductive particles 211 subjected to pressure contact the first electrode 150 and the second electrode 510. Accordingly, the long axis of each of the first conductive particles 211 subject to pressure is parallel to the first surface 110a of the first substrate 110, and the short axis of each first conductive particle 211 is perpendicular to the first surface 110a of the first substrate 110. Accordingly, large contact areas of the first conductive particles 211 are ensured. On the other hand, the second conductive particles 212 are not subject to pressure. Accordingly, the long axis of each second conductive particle 212 remains aligned at a predetermined angle θ with the first surface 110a of the first substrate 110. The predetermined angle θ is an angle greater than about 45 degrees and less than about 90 degrees. Unlike a method of manufacturing the display device 11 of FIG. 30, according to a method of manufacturing the display device 12 of FIG. 31, the conductive particles 210 are inclined at the predetermined angle θ with respect to the first surface 110a of the first substrate 110, so that pressure in the second direction D2 (and third direction D3) is not required when the first substrate 110 and the second substrate 500 are bonded to each other. In other words, even though the first conductive particles 211 are not subject to pressure in the second direction D2 (and third direction D3), the long axis of each first conductive particle 211 is parallel to the first surface 110a of the first substrate 110 due to pressure in the first direction D1.

In an embodiment, conductive particles 210 have a spherical shape pressed in the first direction D1, so that only a low pressure need be applied to the first substrate 110 and the second substrate 500 when the first substrate 110 is bonded to the second substrate 500. Accordingly, a low pressure is applied to the first substrate 110 and the second substrate 500, to avoid damage to the first substrate 110 and the second substrate 500.

In an embodiment, the first conductive particles 211 have a spherical shape pressed in the first direction D1, so that the first flat surface 211a and the second flat surface 211b of the first conductive particles 211 contact the first electrode 150 and the second electrode 510, respectively. Accordingly, wide contact areas between the first conductive particles 211 and the first electrode 150 and between the first conductive particles 211 and the second electrode 510 can be ensured even with low pressure. In addition, the large contact areas are ensured between the conductive particles 210 and the first electrode 150 and the second electrode 510 to ensure a smooth electrical connection between the first substrate 110 and the second substrate 500.

In addition, a distance between the second conductive particles 212 and the first electrodes 150 and the second electrodes 510 adjacent to the second conductive particles 212 is ensured. Accordingly, short-circuits between the first electrodes 150 adjacent to the second conductive particles 212 and between the second electrodes 510 adjacent to the second conductive particles 212 can be prevented.

An anisotropic conductive film and a display device that includes an anisotropic conductive film according to embodiments can be incorporated into a display device included in a computer, a notebook, a mobile phone, a smartphone, a smart pad, a PMP, a PDA, or an MP3 player, etc.

What is claimed is:

1. A display device, comprising:
   a first substrate that includes a first electrode;
   a second substrate disposed under the first substrate and that includes a second electrode that overlaps the first electrode; and
   an anisotropic conductive film disposed between the first substrate and the second substrate, wherein the anisotropic conductive film includes an insulating resin layer and a plurality of conductive particles disposed in the insulating resin layer,
   wherein the conductive particles include first conductive particles that overlap the first electrode and the second electrode, and second conductive particles other than the first conductive particles,
   wherein each of the first conductive particles and the second conductive particles includes a first flat surface, a second flat surface that faces the first flat surface, and a curved surface rounded between the first flat surface and the second flat surface, and
   wherein a first length of each of the first conductive particles and the second conductive particles in a first direction from the first substrate to the second substrate is less than a second length of each of the first conductive particles and the second conductive particles in a second direction orthogonal to the first direction.

2. The display device of claim 1, wherein the insulating resin layer has a thickness greater than or equal to the first length and less than or equal to twice the first length.

3. The display device of claim 1, wherein the first flat surface of each of the first conductive particles contacts with the first electrode, and the second flat surface of each of the first conductive particles contacts with the second electrode.

4. The display device of claim 1, wherein each of the first and second flat surfaces of each of the conductive particles has a circular shape in a plan view.

5. The display device of claim 1, wherein each of the conductive particles includes a polymer bead that includes a thermoplastic resin, and a coating layer that surrounds the polymer bead and includes a metal.

6. The display device of claim 1, further comprising:
a non-conductive film disposed between the second substrate and the anisotropic conductive film.

7. A display device, comprising:
a first substrate that includes a first electrode;
a second substrate disposed under the first substrate and that includes a second electrode that overlaps the first electrode; and
an anisotropic conductive film disposed between the first substrate and the second substrate, wherein the anisotropic conductive film includes an insulating resin layer and a plurality of conductive particles disposed in the insulating resin layer,
wherein the conductive particles include first conductive particles that overlap the first electrode and the second electrode, and second conductive particles other than the first conductive particles,
wherein a first length of each of the first conductive particles in a first direction from the first substrate to the second substrate is less than a second length of each of the first conductive particles in a second direction orthogonal to the first direction, and
wherein a third length of each of the second conductive particles in the first direction is greater than a fourth length of each of the second conductive particles in the second direction.

8. The display device of claim 7, wherein each of the first conductive particles and the second conductive particles includes a first flat surface, a second flat surface that faces the first flat surface, and a curved surface rounded between the first flat surface and the second flat surface.

9. The display device of claim 8, wherein the first flat surface of each of the first conductive particles contacts the first electrode, and the second flat surface of each of the first conductive particles contacts the second electrode.

10. The display device of claim 8, wherein the second flat surface of each of the second conductive particles forms a right angle with respect to a first surface of the first substrate.

11. The display device of claim 8, wherein the second flat surface of each of the second conductive particles forms an angle greater than about 45 degrees and less than about 90 degrees with respect to a first surface of the first substrate.

12. The display device of claim 7, wherein the insulating resin layer has a thickness greater than or equal to the first length of each of the first conductive particles, and less than or equal to twice the third length of each of the second conductive particles.

13. A method of manufacturing a display device, the method comprising:
pressing each of a plurality of polymer beads in one direction;
forming a plurality of conductive particles by plating the plurality of pressed polymer beads with metal;
applying an uncured resin layer to the plurality of conductive particles;
bonding a first substrate that includes a first electrode to a second substrate that includes a second electrode with the uncured resin layer interposed therebetween; and
curing the uncured resin layer wherein the conductive particles are fixed in the cured resin layer.

14. The method of claim 13, further comprising, before applying the uncured resin layer:
arranging a long axis of each of the plurality of conductive particles to be parallel to a first surface of the first substrate, and arranging a short axis of each of the plurality of conductive particles that is orthogonal to the long axis to be perpendicular to the first surface.

15. The method of claim 14, wherein the resin layer has a thickness greater than or equal to a length of the short axis of each of the plurality of conductive particles, and less than or equal to twice the length of the short axis.

16. The method of claim 13, further comprising, before applying the uncured resin layer:
arranging a short axis of each of the plurality of conductive particles to be parallel to a first surface of the first substrate, and arranging a long axis of each of the plurality of conductive particles orthogonal to the short axis to be perpendicular to the first surface.

17. The method of claim 16, wherein the plurality of conductive particles include first conductive particles that overlap the first electrode and the second electrode, and second conductive particles other than the first conductive particles,
wherein bonding the first substrate to the second substrate includes
arranging the long axis of each of the first conductive particles to be parallel to the first surface of the first substrate and arranging the short axis of each of the first conductive particles to be perpendicular to the first surface, and
arranging the long axis of each of the second conductive particles to be perpendicular to the first surface of the first substrate and arranging the short axis of each of the second conductive particles to be parallel to the first surface.

18. The method of claim 17, wherein the resin layer has a thickness greater than or equal to a length of the short axis of each of the first conductive particles, and less than or equal to twice a length of the long axis of each of the second conductive particles.

19. The method of claim 16, wherein the plurality of conductive particles are arranged by using an external magnetic field after magnetizing the plurality of conductive particles.

20. The method of claim 13, further comprising, before applying the uncured resin layer: arranging the conductive particles in a jig that includes a groove.

21. A method of manufacturing a display device, the method comprising:
pressing each of a plurality of polymer beads in one direction;
forming a plurality of conductive particles by plating the plurality of pressed polymer beads with metal;
arranging a first axis of each of the plurality of conductive particles to be parallel to a first surface of the first substrate, and arranging a second axis of each of the plurality of conductive particles that is orthogonal to the first axis to be perpendicular to the first surface;
applying an uncured resin layer to the plurality of conductive particles; and bonding a first substrate that includes a first electrode to a second substrate that includes a second electrode with the uncured resin layer interposed therebetween.

22. The method of claim 21, wherein the first axis is a long axis, and the second axis is a short axis, and wherein the resin layer has a thickness greater than or equal to a length of the short axis of each of the plurality of conductive particles, and less than or equal to twice the length of the short axis.

23. The method of claim 21, wherein the first axis is a short axis, and the second axis is a long axis,
wherein the plurality of conductive particles include first conductive particles that overlap the first electrode and the second electrode, and second conductive particles other than the first conductive particles,
wherein bonding the first substrate to the second substrate includes
arranging the long axis of each of the first conductive particles to be parallel to the first surface of the first substrate and arranging the short axis of each of the first conductive particles to be perpendicular to the first surface, and
arranging the long axis of each of the second conductive particles to be perpendicular to the first surface of the first substrate and arranging the short axis of each of the second conductive particles to be parallel to the first surface, and
wherein the resin layer has a thickness greater than or equal to a length of the short axis of each of the first conductive particles, and less than or equal to twice a length of the long axis of each of the second conductive particles.

24. The method of claim 21, further comprising curing the uncured resin layer wherein the conductive particles are fixed in the cured resin layer.

* * * * *